(12) United States Patent
Miyasaka et al.

(10) Patent No.: US 6,484,142 B1
(45) Date of Patent: Nov. 19, 2002

(54) ENCODER USING HUFFMAN CODES

(75) Inventors: Shuji Miyasaka, Osaka (JP); Takeshi Norimatsu, Hyogo (JP); Mineo Tsushima, Osaka (JP); Tomokazu Ishikawa, Osaka (JP); Yoshiaki Sawada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/551,796

(22) Filed: Apr. 18, 2000

(30) Foreign Application Priority Data

Apr. 20, 1999 (JP) .......................... 11-112953
Dec. 16, 1999 (JP) .......................... 11-358194

(51) Int. Cl.[7] .................. G10L 19/14; H03M 7/40; H04N 1/41
(52) U.S. Cl. .................. 704/500; 704/201; 341/65; 358/426.13
(58) Field of Search ............. 704/229, 230, 704/201, 219, 200, 500; 341/341, 65; 358/426.13

(56) References Cited

U.S. PATENT DOCUMENTS 5,371,544 A * 12/1994 Jacquin et al. ............... 704/200
5,819,215 A * 10/1998 Dobson et al. ............... 704/230
5,845,243 A * 12/1998 Smart et al. .................. 704/229

OTHER PUBLICATIONS

Moffat et al ("On The Implementation Of Minimum–Redundancy Prefix Codes", Data Compression Conference Proceedings, pp. 170–179, Mar. 1996).*
ISO/TEC ("Noiseless Coding", ISO/TEC 13818–7:1997(E). pp. 67–69.).*
"Noiseless Coding", ISO/IEC 13818–7:1997(E): pp. 67–69.

* cited by examiner

Primary Examiner—Richemond Dorvil
Assistant Examiner—Daniel A Nolan
(74) Attorney, Agent, or Firm—Michael K. Kelly; Snell & Wilmer, LLP

(57) ABSTRACT

An encoder of the present invention includes: G storage sections for storing G groups of data; a selection section for selecting one of H Huffman codebooks having codebook numbers for each of the groups of data; G encoding sections Huffman-encoding the G groups of data by using the selected Huffman codebook; and an encoding section for encoding the codebook number of each Huffman codebook selected. The selection section includes a calculation section for calculating a code length and a control section for selecting one of the Huffman codebooks. When the Huffman codebook selected is an unsigned codebook, a number of bits required for sign information has previously been added to the calculated code length.

36 Claims, 20 Drawing Sheets

FIG. 2

| index | length of HCB3 | length of HCB4 |
|---|---|---|
| 0 | 1 (= 1+0) | 4 (= 4+0) |
| 1 | 5 (= 4+1) | 6 (= 5+1) |
| 2 | 9 (= 8+1) | 9 (= 8+1) |
| 3 | 5 (= 4+1) | 6 (= 5+1) |
| 4 | 7 (= 5+2) | 6 (= 4+2) |
| 5 | 10 (= 8+2) | 10 (= 8+2) |
| 6 | 10 (= 9+1) | 10 (= 9+1) |
| 7 | 11 (= 9+2) | 10 (= 8+2) |
| 8 | 12 (=10+2) | 13 (=11+2) |
| 9 | 5 (= 4+1) | 6 (= 5+1) |
| 10 | 8 (= 6+2) | 7 (= 5+2) |
| 11 | 11 (= 9+2) | 10 (= 8+2) |
| 12 | 8 (= 6+2) | 7 (= 5+2) |
| 13 | 9 (= 6+3) | 7 (= 4+3) |
| 14 | 12 (= 9+3) | 11 (= 8+3) |
| 15 | 11 (= 9+2) | 10 (= 8+2) |
| 16 | 12 (= 9+3) | 10 (= 7+3) |
| 17 | 13 (=10+3) | 13 (=10+3) |
| 18 | 10 (= 9+1) | 10 (= 9+1) |
| 19 | 12 (=10+2) | 10 (= 8+2) |
| 20 | 15 (=13+2) | 13 (=11+2) |
| 21 | 11 (= 9+2) | 10 (= 8+2) |
| 22 | 12 (= 9+3) | 11 (= 8+3) |
| 23 | 14 (=11+3) | 13 (=10+3) |
| 24 | 13 (=11+2) | 13 (=11+2) |
| 25 | 13 (=10+3) | 13 (=10+3) |
| 26 | 15 (=12+3) | 14 (=11+3) |
| 27 | 5 (= 4+1) | 5 (= 4+1) |
| 28 | 8 (= 6+2) | 7 (= 5+2) |
| 29 | 12 (=10+2) | 10 (= 8+2) |
| 30 | 8 (= 6+2) | 6 (= 4+2) |
| 31 | 10 (= 7+3) | 7 (= 4+3) |
| 32 | 13 (=10+3) | 11 (= 8+3) |
| 33 | 12 (=10+2) | 10 (= 8+2) |
| 34 | 13 (=10+3) | 11 (= 8+3) |
| 35 | 15 (=12+3) | 13 (=10+3) |
| 36 | 7 (= 5+2) | 6 (= 4+2) |
| 37 | 10 (= 7+3) | 7 (= 4+3) |
| 38 | 14 (=11+3) | 11 (= 8+3) |
| 39 | 9 (= 6+3) | 7 (= 4+3) |
| 40 | 11 (= 7+4) | 8 (= 4+4) |
| 41 | 14 (=10+4) | 11 (= 7+4) |
| 42 | 12 (= 9+3) | 11 (= 8+3) |
| 43 | 13 (= 9+4) | 11 (= 7+4) |
| 44 | 15 (=11+4) | 13 (= 9+4) |
| 45 | 11 (= 9+2) | 10 (= 8+2) |
| 46 | 13 (=10+3) | 11 (= 8+3) |
| 47 | 16 (=13+3) | 13 (=10+3) |
| 48 | 11 (= 8+3) | 10 (= 7+3) |
| 49 | 13 (= 9+4) | 11 (= 7+4) |
| 50 | 16 (=12+4) | 13 (= 9+4) |
| 51 | 13 (=10+3) | 13 (=10+3) |
| 52 | 15 (=11+4) | 13 (= 9+4) |
| 53 | 16 (=12+4) | 14 (=10+4) |
| 54 | 9 (= 8+1) | 9 (= 8+1) |
| 55 | 12 (=10+2) | 10 (= 8+2) |
| 56 | 17 (=15+2) | 13 (=11+2) |
| 57 | 11 (= 9+2) | 10 (= 8+2) |
| 58 | 14 (=11+3) | 10 (= 7+3) |
| 59 | 18 (=15+3) | 13 (=10+3) |
| 60 | 15 (=13+2) | 13 (=11+2) |
| 61 | 17 (=14+3) | 13 (=10+3) |
| 62 | 19 (=16+3) | 15 (=12+3) |
| 63 | 10 (= 8+2) | 10 (= 8+2) |
| 64 | 13 (=10+3) | 10 (= 7+3) |
| 65 | 17 (=14+3) | 13 (=10+3) |
| 66 | 12 (= 9+3) | 10 (= 7+3) |
| 67 | 14 (=10+4) | 11 (= 7+4) |
| 68 | 18 (=14+4) | 13 (= 9+4) |
| 69 | 15 (=12+3) | 13 (=10+3) |
| 70 | 16 (=12+4) | 13 (= 9+4) |
| 71 | 19 (=15+4) | 15 (=11+4) |
| 72 | 13 (=11+2) | 13 (=11+2) |
| 73 | 15 (=12+3) | 13 (=10+3) |
| 74 | 19 (=16+3) | 15 (=12+3) |
| 75 | 13 (=10+3) | 13 (=10+3) |
| 76 | 15 (=11+4) | 13 (= 9+4) |
| 77 | 19 (=15+4) | 15 (=11+4) |
| 78 | 15 (=12+3) | 14 (=11+3) |
| 79 | 16 (=12+4) | 14 (=10+4) |
| 80 | 19 (=15+4) | 15 (=11+4) |

FIG. 3

| index | length of HCB5 | length of HCB6 |
|---|---|---|
| 0 | 13 | 11 |
| 1 | 12 | 10 |
| 2 | 11 | 9 |
| 3 | 11 | 9 |
| 4 | 10 | 9 |
| 5 | 11 | 9 |
| 6 | 11 | 9 |
| 7 | 12 | 10 |
| 8 | 13 | 11 |
| 9 | 12 | 10 |
| 10 | 11 | 9 |
| 11 | 10 | 8 |
| 12 | 9 | 7 |
| 13 | 8 | 7 |
| 14 | 9 | 7 |
| 15 | 10 | 8 |
| 16 | 11 | 9 |
| 17 | 12 | 10 |
| 18 | 12 | 9 |
| 19 | 10 | 8 |
| 20 | 9 | 6 |
| 21 | 8 | 6 |
| 22 | 7 | 6 |
| 23 | 8 | 6 |
| 24 | 9 | 6 |
| 25 | 10 | 8 |
| 26 | 11 | 9 |
| 27 | 11 | 9 |
| 28 | 9 | 7 |
| 29 | 8 | 6 |
| 30 | 5 | 4 |
| 31 | 4 | 4 |
| 32 | 5 | 4 |
| 33 | 8 | 6 |
| 34 | 9 | 7 |
| 35 | 11 | 9 |
| 36 | 10 | 9 |
| 37 | 8 | 7 |
| 38 | 7 | 6 |
| 39 | 4 | 4 |
| 40 | 1 | 4 |
| 41 | 4 | 4 |
| 42 | 7 | 6 |
| 43 | 8 | 7 |
| 44 | 11 | 9 |
| 45 | 11 | 9 |
| 46 | 9 | 7 |
| 47 | 8 | 6 |
| 48 | 5 | 4 |
| 49 | 4 | 4 |
| 50 | 5 | 4 |
| 51 | 8 | 6 |
| 52 | 9 | 7 |
| 53 | 11 | 9 |
| 54 | 11 | 9 |
| 55 | 10 | 8 |
| 56 | 9 | 6 |
| 57 | 8 | 6 |
| 58 | 7 | 6 |
| 59 | 8 | 6 |
| 60 | 9 | 6 |
| 61 | 10 | 8 |
| 62 | 11 | 9 |
| 63 | 12 | 10 |
| 64 | 11 | 9 |
| 65 | 10 | 8 |
| 66 | 9 | 7 |
| 67 | 8 | 7 |
| 68 | 9 | 7 |
| 69 | 10 | 7 |
| 70 | 11 | 8 |
| 71 | 12 | 10 |
| 72 | 13 | 11 |
| 73 | 12 | 10 |
| 74 | 12 | 9 |
| 75 | 11 | 9 |
| 76 | 10 | 9 |
| 77 | 10 | 9 |
| 78 | 11 | 9 |
| 79 | 12 | 10 |
| 80 | 13 | 11 |

FIG. 8

| adrs | data |
|---|---|
| 00 | 01030104 |
| 01 | 05050506 |
| 02 | 00000909 |
| 03 | 05050506 |
| 04 | 05050506 |
| 05 | 07060706 |
| 06 | 00000a0a |
| 07 | 07060706 |
| 08 | 00000a0a |
| 09 | 00000b0a |
| 0a | 00000c0d |
| 0b | 00000b0a |
| 0c | 05050506 |
| 0d | 07060706 |
| 0e | 00000a0a |
| 0f | 07060706 |
| 10 | 05050506 |
| 11 | 07060807 |
| 12 | 00000b0a |
| 13 | 07060807 |
| 14 | 07060807 |
| 15 | 09080907 |
| 69 | 00000f0d |
| 6a | 0000100e |
| 6b | 00000f0d |
| 6c | 00000b0a |
| 6d | 00000d0b |
| 6e | 0000100d |
| 6f | 00000d0b |
| 70 | 07060706 |
| 71 | 09080a07 |
| 72 | 00000e0b |
| 73 | 09080a07 |
| 74 | 09070907 |
| 75 | 0b090b08 |
| 76 | 00000e0b |
| 77 | 0b080b08 |
| 78 | 00000c0b |
| 79 | 00000d0b |
| 7a | 00000f0d |
| 7b | 00000d0b |
| 7c | 09070907 |
| 7d | 0b090b08 |
| 7e | 00000e0b |
| 7f | 0b090b08 |
| 80 | 00000909 |
| e7 | 00000d0b |
| e8 | 00000d0d |
| e9 | 00000f0d |
| ea | 0000100e |
| eb | 00000f0d |
| ec | 00000b0a |
| ed | 00000d0b |
| ee | 0000100d |
| ef | 00000d0b |
| f0 | 07060706 |
| f1 | 0a080a07 |
| f2 | 00000e0b |
| f3 | 0a080a07 |
| f4 | 09080907 |
| f5 | 0b090b08 |
| f6 | 00000e0b |
| f7 | 0b090b08 |
| f8 | 00000c0b |
| f9 | 00000d0b |
| fa | 00000f0d |
| fb | 00000d0b |
| fc | 09070907 |
| fd | 0b090b08 |
| fe | 00000e0b |
| ff | 0b090b08 |

1101 — adrs
1102 — data
1100

FIG.10

| adrs | data |
|------|------|
| 000 | 010401050106 |
| 001 | 040404050406 |
| 002 | 070607060707 |
| 003 | 080708070907 |
| 004 | 0b0909080a08 |
| 005 | 00000a090b09 |
| 006 | 00000b0a0b0a |
| 007 | 00000c0b0c0b |
| 008 | 000000000c0b |
| 009 | 000000000d0b |
| 00a | 000000000d0c |
| 00b | 000000000e0c |
| 00c | 000000000e0d |
| 00d | 000000000000 |
| 00e | 000000000000 |
| 00f | 000000000000 |
| 010 | 000000000000 |
| 011 | 000000000000 |
| 012 | 000000000000 |
| 013 | 000000000000 |
| 014 | 000000000e0d |
| 015 | 000000000e0c |
| 016 | 000000000d0c |
| 08e | 000000000000 |
| 08f | 000000000000 |
| 090 | 000000000000 |
| 091 | 000000000000 |
| 092 | 000000000000 |
| 093 | 000000000000 |
| 094 | 000000000f0c |
| 095 | 000000000e0c |
| 096 | 000000000e0b |
| 097 | 000000000e0b |
| 098 | 000000000d0a |
| 099 | 00000d0b0d0a |
| 09a | 00000c0a0d09 |
| 09b | 00000c090c09 |
| 09c | 0d0b0c090c08 |
| 09d | 0c0a0b080b08 |
| 09e | 0c090b080b08 |
| 09f | 0b090a080a08 |
| 0a0 | 00000a090b09 |
| 0a1 | 00000a090b09 |
| 0a2 | 00000b080b08 |
| 0a3 | 00000b090c09 |
| 0a4 | 00000c090d09 |
| 0a5 | 00000c0a0d09 |
| 0a6 | 00000d0a0d0a |
| 3e8 | 000000000c0a |
| 3e9 | 000000000c0b |
| 3ea | 000000000d0c |
| 3eb | 000000000e0c |
| 3ec | 000000000e0d |
| 3ed | 000000000000 |
| 3ee | 000000000000 |
| 3ef | 000000000000 |
| 3f0 | 000000000000 |
| 3f1 | 000000000000 |
| 3f2 | 000000000000 |
| 3f3 | 000000000000 |
| 3f4 | 000000000e0d |
| 3f5 | 000000000e0c |
| 3f6 | 000000000d0c |
| 3f7 | 000000000c0b |
| 3f8 | 000000000c0a |
| 3f9 | 00000b0a0c0a |
| 3fa | 00000b090b09 |
| 3fb | 00000a090a09 |
| 3fc | 0b090a080a08 |
| 3fd | 090709070907 |
| 3fe | 080608060806 |
| 3ff | 050406050606 |

FIG. 12

| adrs | data |
|---|---|
| 000 | 0010040010050001006 |
| 001 | 0040040040050040006 |
| 002 | 0070060070060070007 |
| 003 | 0080070080070090007 |
| 004 | 00b0090090080a008 |
| 005 | 00000000a0090b009 |
| 006 | 000000000b00a00b00a |
| 007 | 000000000c00b00c00b |
| 008 | 00000000000c00b |
| 009 | 0000000000000d00b |
| 00a | 0000000000000d00c |
| 00b | 000000000000e00c |
| 00c | 000000000000e00d |
| 00d | 0000000000000000 |
| 00e | 0000000000000000 |
| 00f | 0000000000000000 |
| 010 | 0000000000000000 |
| 011 | 0000000000000000 |
| 012 | 0000000000000000 |
| 013 | 0000000000000000 |
| 014 | 0000000000000e00d |
| 015 | 000000000000e00c |
| 016 | 000000000000d00c |
| 08e | 0000000000000000 |
| 08f | 0000000000000000 |
| 090 | 0000000000000000 |
| 091 | 0000000000000000 |
| 092 | 0000000000000000 |
| 093 | 0000000000000000 |
| 094 | 0000000000000f00c |
| 095 | 0000000000000e00c |
| 096 | 000000000000e00b |
| 097 | 000000000000e00b |
| 098 | 000000000000d00a |
| 099 | 00000000d00b00d00a |
| 09a | 00000000c00a00d009 |
| 09b | 00000000c00900c009 |
| 09c | 00d00b00c00900c008 |
| 09d | 00c00a00b00800b008 |
| 09e | 00c0090b0080b008 |
| 09f | 00b00900a0080a008 |
| 0a0 | 00000000a0090b009 |
| 0a1 | 00000000a0090b009 |
| 0a2 | 000000000b00800b008 |
| 0a3 | 000000000b00900c009 |
| 0a4 | 000000000c00900d009 |
| 0a5 | 00000000c00a00d009 |
| 0a6 | 00000000d00a00d00a |
| 3e8 | 0000000000000c00a |
| 3e9 | 0000000000000c00b |
| 3ea | 000000000000c00b |
| 3eb | 000000000000e00c |
| 3ec | 000000000000e00d |
| 3ed | 0000000000000000 |
| 3ee | 0000000000000000 |
| 3ef | 0000000000000000 |
| 3f0 | 0000000000000000 |
| 3f1 | 0000000000000000 |
| 3f2 | 0000000000000000 |
| 3f3 | 0000000000000000 |
| 3f4 | 000000000000e00d |
| 3f5 | 000000000000e00c |
| 3f6 | 000000000000d00c |
| 3f7 | 000000000000c00b |
| 3f8 | 000000000000c00a |
| 3f9 | 00000000b00a00c00a |
| 3fa | 00000000b00900b009 |
| 3fb | 00000000a0090a009 |
| 3fc | 00b00900a00800a008 |
| 3fd | 0090070080060090007 |
| 3fe | 0080060080060090007 |
| 3ff | 0050040060050060006 |

1501 adrs
1502 data
1500

FIG. 13

| adrs | data | | | | | | | | | | | |
|------|------|------|------|------|------|------|------|------|------|------|------|------|
| | 12bit | | 12bit | | 12bit | | 12bit | | 12bit | | 12bit | |
| 000 | 0 | HCB5 | 0 | HCB6 | 0 | HCB7 | 0 | HCB8 | 0 | HCB9 | 0 | HCB10 |
| 001 | 0 | HCB5 | 0 | HCB6 | 0 | HCB7 | 0 | HCB8 | 0 | HCB9 | 0 | HCB10 |
| 002 | 0 | HCB5 | 0 | HCB6 | 0 | HCB7 | 0 | HCB8 | 0 | HCB9 | 0 | HCB10 |
| 003 | 0 | HCB5 | 0 | HCB6 | 0 | HCB7 | 0 | HCB8 | 0 | HCB9 | 0 | HCB10 |
| ⋮ | | | | | | | | | | | | |
| 3ff | 0 | HCB5 | 0 | HCB6 | 0 | HCB7 | 0 | HCB8 | 0 | HCB9 | 0 | HCB10 |

| SFB | spectrum | value |
|---|---|---|
| SFB0 | 0<br>1<br>2<br>3 | 4<br>−2<br>0<br>3 |
| SFB1 | 4<br>5<br>6<br>7 | −2<br>−2<br>3<br>−1 |
| SFB2 | 8<br>9<br>10<br>11 | 1<br>−1<br>1<br>0 |
| ⋮ | ⋮ | ⋮ |
| SFB(G−1) | ⋮ | ⋮ |

FIG. 16   Spectrum Huffman Codebook 3

| index | length | codeword (hexadecimal) | index | length | codeword (hexadecimal) |
|---|---|---|---|---|---|
| 0 | 1 | 0 | 41 | 10 | 3ef |
| 1 | 4 | 9 | 42 | 9 | 1f3 |
| 2 | 8 | ef | 43 | 9 | 1f4 |
| 3 | 4 | b | 44 | 11 | 7f6 |
| 4 | 5 | 19 | 45 | 9 | 1e8 |
| 5 | 8 | f0 | 46 | 10 | 3ea |
| 6 | 9 | 1eb | 47 | 13 | 1ffc |
| 7 | 9 | 1e6 | 48 | 8 | f2 |
| 8 | 10 | 3f2 | 49 | 9 | 1f1 |
| 9 | 4 | a | 50 | 12 | ffb |
| 10 | 6 | 35 | 51 | 10 | 3f5 |
| 11 | 9 | 1ef | 52 | 11 | 7f3 |
| 12 | 6 | 34 | 53 | 12 | ffc |
| 13 | 6 | 37 | 54 | 8 | ee |
| 14 | 9 | 1e9 | 55 | 10 | 3f7 |
| 15 | 9 | 1ed | 56 | 15 | 7ffe |
| 16 | 9 | 1e7 | 57 | 9 | 1f0 |
| 17 | 10 | 3f3 | 58 | 11 | 7f5 |
| 18 | 9 | 1ee | 59 | 15 | 7ffd |
| 19 | 10 | 3ed | 60 | 13 | 1ffb |
| 20 | 13 | 1ffa | 61 | 14 | 3ffa |
| 21 | 9 | 1ec | 62 | 16 | ffff |
| 22 | 9 | 1f2 | 63 | 8 | f1 |
| 23 | 11 | 7f9 | 64 | 10 | 3f0 |
| 24 | 11 | 7f8 | 65 | 14 | 3ffc |
| 25 | 10 | 3f8 | 66 | 9 | 1ea |
| 26 | 12 | ff8 | 67 | 10 | 3ee |
| 27 | 4 | 8 | 68 | 14 | 3ffb |
| 28 | 6 | 38 | 69 | 12 | ff6 |
| 29 | 10 | 3f6 | 70 | 12 | ffa |
| 30 | 6 | 36 | 71 | 15 | 7ffc |
| 31 | 7 | 75 | 72 | 11 | 7f2 |
| 32 | 10 | 3f1 | 73 | 12 | ff5 |
| 33 | 10 | 3eb | 74 | 16 | fffe |
| 34 | 10 | 3ec | 75 | 10 | 3f4 |
| 35 | 12 | ff4 | 76 | 11 | 7f7 |
| 36 | 5 | 18 | 77 | 15 | 7ffb |
| 37 | 7 | 76 | 78 | 12 | ff7 |
| 38 | 11 | 7f4 | 79 | 12 | ff9 |
| 39 | 6 | 39 | 80 | 15 | 7ffa |
| 40 | 7 | 74 | | | |

FIG. 17

Spectrum Huffman Codebook 4

| index | length | codeword (hexadecimal) | index | length | codeword (hexadecimal) |
|---|---|---|---|---|---|
| 0 | 4 | 7 | 41 | 7 | 6b |
| 1 | 5 | 16 | 42 | 8 | e3 |
| 2 | 8 | f6 | 43 | 7 | 69 |
| 3 | 5 | 18 | 44 | 9 | 1f3 |
| 4 | 4 | 8 | 45 | 8 | eb |
| 5 | 8 | ef | 46 | 8 | e6 |
| 6 | 9 | 1ef | 47 | 10 | 3f6 |
| 7 | 8 | f3 | 48 | 7 | 6e |
| 8 | 11 | 7f8 | 49 | 7 | 6a |
| 9 | 5 | 19 | 50 | 9 | 1f4 |
| 10 | 5 | 17 | 51 | 10 | 3ec |
| 11 | 8 | ed | 52 | 9 | 1f0 |
| 12 | 5 | 15 | 53 | 10 | 3f9 |
| 13 | 4 | 1 | 54 | 8 | f5 |
| 14 | 8 | e2 | 55 | 8 | ec |
| 15 | 8 | f0 | 56 | 11 | 7fb |
| 16 | 7 | 70 | 57 | 8 | ea |
| 17 | 10 | 3f0 | 58 | 7 | 6f |
| 18 | 9 | 1ee | 59 | 10 | 3f7 |
| 19 | 8 | f1 | 60 | 11 | 7f9 |
| 20 | 11 | 7fa | 61 | 10 | 3f3 |
| 21 | 8 | ee | 62 | 12 | fff |
| 22 | 8 | e4 | 63 | 8 | e9 |
| 23 | 10 | 3f2 | 64 | 7 | 6d |
| 24 | 11 | 7f6 | 65 | 10 | 3f8 |
| 25 | 10 | 3ef | 66 | 7 | 6c |
| 26 | 11 | 7fd | 67 | 7 | 68 |
| 27 | 4 | 5 | 68 | 9 | 1f5 |
| 28 | 5 | 14 | 69 | 10 | 3ee |
| 29 | 8 | f2 | 70 | 9 | 1f2 |
| 30 | 4 | 9 | 71 | 11 | 7f4 |
| 31 | 4 | 4 | 72 | 11 | 7f7 |
| 32 | 8 | e5 | 73 | 10 | 3f1 |
| 33 | 8 | f4 | 74 | 12 | ffe |
| 34 | 8 | e8 | 75 | 10 | 3ed |
| 35 | 10 | 3f4 | 76 | 9 | 1f1 |
| 36 | 4 | 6 | 77 | 11 | 7f5 |
| 37 | 4 | 2 | 78 | 11 | 7fe |
| 38 | 8 | e7 | 79 | 10 | 3f5 |
| 39 | 4 | 3 | 80 | 11 | 7fc |
| 40 | 4 | 0 | | | |

FIG. 18   Spectrum Huffman Codebook 5

| index | length | codeword (hexadecimal) | index | length | codeword (hexadecimal) |
|---|---|---|---|---|---|
| 0 | 13 | 1fff | 41 | 4 | a |
| 1 | 12 | ff7 | 42 | 7 | 71 |
| 2 | 11 | 7f4 | 43 | 8 | f3 |
| 3 | 11 | 7e8 | 44 | 11 | 7e9 |
| 4 | 10 | 3f1 | 45 | 11 | 7ef |
| 5 | 11 | 7ee | 46 | 9 | 1ee |
| 6 | 11 | 7f9 | 47 | 8 | ef |
| 7 | 12 | ff8 | 48 | 5 | 18 |
| 8 | 13 | 1ffd | 49 | 4 | 9 |
| 9 | 12 | ffd | 50 | 5 | 1b |
| 10 | 11 | 7f1 | 51 | 8 | eb |
| 11 | 10 | 3e8 | 52 | 9 | 1e9 |
| 12 | 9 | 1e8 | 53 | 11 | 7ec |
| 13 | 8 | f0 | 54 | 11 | 7f6 |
| 14 | 9 | 1ec | 55 | 10 | 3eb |
| 15 | 10 | 3ee | 56 | 9 | 1f3 |
| 16 | 11 | 7f2 | 57 | 8 | ed |
| 17 | 12 | ffa | 58 | 7 | 72 |
| 18 | 12 | ff4 | 59 | 8 | e9 |
| 19 | 10 | 3ef | 60 | 9 | 1f1 |
| 20 | 9 | 1f2 | 61 | 10 | 3ed |
| 21 | 8 | e8 | 62 | 11 | 7f7 |
| 22 | 7 | 70 | 63 | 12 | ff6 |
| 23 | 8 | ec | 64 | 11 | 7f0 |
| 24 | 9 | 1f0 | 65 | 10 | 3e9 |
| 25 | 10 | 3ea | 66 | 9 | 1ed |
| 26 | 11 | 7f3 | 67 | 8 | f1 |
| 27 | 11 | 7eb | 68 | 9 | 1ea |
| 28 | 9 | 1eb | 69 | 10 | 3ec |
| 29 | 8 | ea | 70 | 11 | 7f8 |
| 30 | 5 | 1a | 71 | 12 | ff9 |
| 31 | 4 | 8 | 72 | 13 | 1ffc |
| 32 | 5 | 19 | 73 | 12 | ffc |
| 33 | 8 | ee | 74 | 12 | ff5 |
| 34 | 9 | 1ef | 75 | 11 | 7ea |
| 35 | 11 | 7ed | 76 | 10 | 3f3 |
| 36 | 10 | 3f0 | 77 | 10 | 3f2 |
| 37 | 8 | f2 | 78 | 11 | 7f5 |
| 38 | 7 | 73 | 79 | 12 | ffb |
| 39 | 4 | b | 80 | 13 | 1ffe |
| 40 | 1 | 0 | | | |

FIG. 19 Spectrum Huffman Codebook 6

| index | length | codeword (hexadecimal) | index | length | codeword (hexadecimal) |
|---|---|---|---|---|---|
| 0 | 11 | 7fe | 41 | 4 | 3 |
| 1 | 10 | 3fd | 42 | 6 | 2f |
| 2 | 9 | 1f1 | 43 | 7 | 73 |
| 3 | 9 | 1eb | 44 | 9 | 1fa |
| 4 | 9 | 1f4 | 45 | 9 | 1e7 |
| 5 | 9 | 1ea | 46 | 7 | 6e |
| 6 | 9 | 1f0 | 47 | 6 | 2b |
| 7 | 10 | 3fc | 48 | 4 | 7 |
| 8 | 11 | 7fd | 49 | 4 | 1 |
| 9 | 10 | 3f6 | 50 | 4 | 5 |
| 10 | 9 | 1e5 | 51 | 6 | 2c |
| 11 | 8 | ea | 52 | 7 | 6d |
| 12 | 7 | 6c | 53 | 9 | 1ec |
| 13 | 7 | 71 | 54 | 9 | 1f9 |
| 14 | 7 | 68 | 55 | 8 | ee |
| 15 | 8 | f0 | 56 | 6 | 30 |
| 16 | 9 | 1e6 | 57 | 6 | 24 |
| 17 | 10 | 3f7 | 58 | 6 | 2a |
| 18 | 9 | 1f3 | 59 | 6 | 25 |
| 19 | 8 | ef | 60 | 6 | 33 |
| 20 | 6 | 32 | 61 | 8 | ec |
| 21 | 6 | 27 | 62 | 9 | 1f2 |
| 22 | 6 | 28 | 63 | 10 | 3f8 |
| 23 | 6 | 26 | 64 | 9 | 1e4 |
| 24 | 6 | 31 | 65 | 8 | ed |
| 25 | 8 | eb | 66 | 7 | 6a |
| 26 | 9 | 1f7 | 67 | 7 | 70 |
| 27 | 9 | 1e8 | 68 | 7 | 69 |
| 28 | 7 | 6f | 69 | 7 | 74 |
| 29 | 6 | 2e | 70 | 8 | f1 |
| 30 | 4 | 8 | 71 | 10 | 3fa |
| 31 | 4 | 4 | 72 | 11 | 7ff |
| 32 | 4 | 6 | 73 | 10 | 3f9 |
| 33 | 6 | 29 | 74 | 9 | 1f6 |
| 34 | 7 | 6b | 75 | 9 | 1ed |
| 35 | 9 | 1ee | 76 | 9 | 1f8 |
| 36 | 9 | 1ef | 77 | 9 | 1e9 |
| 37 | 7 | 72 | 78 | 9 | 1f5 |
| 38 | 6 | 2d | 79 | 10 | 3fd |
| 39 | 4 | 2 | 80 | 11 | 7fc |
| 40 | 4 | 0 | | | |

FIG. 20 Spectrum Huffman Codebook Parameters

| Codebook Number, i | unsigned_cb[i] | Dimension of Codebook | LAV for codebook | Codebook listed in Table |
|---|---|---|---|---|
| 0 | – | – | 0 | – |
| 1 | 0 | 4 | 1 | A.2 |
| 2 | 0 | 4 | 1 | A.3 |
| 3 | 1 | 4 | 2 | A.4 |
| 4 | 1 | 4 | 2 | A.5 |
| 5 | 0 | 2 | 4 | A.6 |
| 6 | 0 | 2 | 4 | A.7 |
| 7 | 1 | 2 | 7 | A.8 |
| 8 | 1 | 2 | 7 | A.9 |
| 9 | 1 | 2 | 12 | A.10 |
| 10 | 1 | 2 | 12 | A.11 |
| 11 | 1 | 2 | (16)ESC | A.12 |
| 12 | – | – | (reserved) | – |

US 6,484,142 B1

ENCODER USING HUFFMAN CODES

BACKGROUND OF THE INVENTION

1. Field of the Invention

The present invention relates to an encoder using Huffman codes. More particularly, the present invention relates to an encoder capable of selecting the optimal Huffman codebook from among a plurality of Huffman codebooks so as to encode digital data by using the optimally selected Huffman codebook.

2. Description of the Related Art

In recent years, efficient audio signal compression methods encode spectral data of quantized audio signals by using a Huffman encoding scheme. A conventional data compression method, for example, a data compression method disclosed in the MPEG2-AAC standard will now be described (see ISO/IEC 13818-7).

First, an input PCM (Pulse Code Modulation) signal is converted through an MDCT (Modified Discrete Cosine Transform) operation into 1024 elements of frequency spectral data. This process is described in detail in "ISO/IEC 13818-7 ANNEX B 2.3 FilterBank and block switching" and will not be discussed below. "ISO/IEC 13818-7 ANNEX B 2.3 FilterBank and block switching is incorporated by reference in its entirety.

Then, the 1024 elements of frequency spectral data are quantized (converted into integers) by using a non-linear quantization method. This process is described in detail in "ISO/IEC 13818-7 ANNEX B 2.7 Quantizing" and will not be discussed below. "ISO/IEC 13818-7 ANNEX B 2.7 Quantizing" is incorporated by reference in its entirety.

Next, the 1024 elements of quantized frequency spectral data are grouped into a number of scale factor bands (in this specification, a scale factor band (SFB) may also be referred to as a "group of data"). Using a sampling frequency of 48 kHz, for example, the 1024 elements of quantized frequency spectral data would be grouped into 49 SFBs. Referring now to FIG. 14, the grouping of frequency spectral data is performed as shown in a table 450. For example, the frequency spectral data is grouped into SFBs so that SFB0 includes four elements 0–3 of the frequency spectral data (as shown in row 451), SFB1 includes four elements 4–7 of the frequency spectral data (as shown in row 452), and SFB2 includes four elements 8–11 of the frequency spectral data. (as shown in row 453) (see "ISO/IEC 13818-7 3.8 Tables").

Referring to FIG. 15, a table 500 illustrating frequency spectral data which has been quantized and grouped into a number of SFBs (SFB0 to SFB(G−1)) in a process as described above is shown. In FIG. 15, left column 501 designated "SFB" shows a number of SFBs (SFB0 to SFB(G−1)), center column 502 designated "spectrum" shows frequency spectral data numbers, and right column 503 designated "value" shows the absolute value of each frequency spectral data.

Then, the quantized and grouped frequency spectral data is Huffman-encoded for each SFB. The Huffman encoding operation is performed based on one Huffman codebook which is selected for each SFB from among a plurality of Huffman codebooks. According to the MPEG2-AAC standard, a Huffman codebook is selected from among eleven Huffman codebooks (Huffman codebooks 1–11). In the following description, however, only four Huffman codebooks (Huffman codebooks 3–6) are used for the sake of simplicity.

FIGS. 16 to 19 illustrate Huffman codebooks 3–6, respectively. In the Huffman codebooks 3–6 illustrated in FIGS. 16 to 19, respectively, the leftmost column designated "index" shows the index number of each data to be encoded, the second column designated "length" shows the code length of each encoded data, and the third column designated "codeword (hexadecimal)" shows a hexadecimal representation of each encoded data (codeword). The Huffman codebooks 3–6 illustrated in FIGS. 16 to 19 each contain the code length of each encoded data (length) and a hexadecimal representation of each encoded data (codeword) for index numbers 0–80.

In SFB0 shown in FIG. 15, the largest absolute spectral data value is 4. According to the MPEG2-AAC standard, Huffman codebooks that can be selected for an input signal are limited by the largest absolute value of the input signal. This limitation is determined by LAV (largest absolute value) as shown in FIG. 20. LAV of a Huffman codebook denotes the largest absolute value of input data that can be encoded by using a particular Huffman codebook. According to the table shown in FIG. 20, when the largest absolute spectral data value in SFB0 is 4, Huffman codebooks 5 and 6 are the candidate Huffman codebooks. The code length which would result when encoding data with the candidate Huffman codebook 5 is compared with the code length which would result when encoding data with the candidate Huffman codebook 6. The candidate Huffman codebook that gives the smaller code length is selected. In this example, where the Huffman codebooks 5 and 6 are candidates, the code length which would result when Huffman-encoding data with the candidate Huffman codebooks is calculated as follows:

First, two index values "index0" and "index1" are calculated from Expressions (1) and (2) below:

$$\text{index0} = (D0 + LAV) * (2 * LAV + 1) + (D1 + LAV) \quad (1)$$

$$\text{index1} = (D2 + LAV) * (2 * LAV + 1) + (D3 + LAV) \quad (2)$$

where D0, D1, D2 and D3 respectively denote the four spectral data elements (values) of SFB0. The calculated values of "index0" and "index1" are used as the index values. The code length "length" for the candidate Huffman codebooks 5 and 6 is obtained based on the index values.

Referring to FIG. 15, substituting the following values into Expressions (1) and (2), D0=4, D1=−2, D2=0, D3=3 and LAV=4, result in index0=74 and index1=43. Referring to the Huffman codebook 5 shown in FIG. 18, a length=12 for index0=74 and a length=8 for index1=43 can be determined, indicating that the code length would be 20 (12+8) bits when Huffman-encoding data with the Huffman codebook 5. Referring to the Huffman codebook 6 shown in FIG. 19, a length=9 for index0=74 and a length=7 for index1=43 can be determined, indicating that the code length would be 16 (9+7) bits when Huffman-encoding data with the Huffman codebook 6. Therefore, it is more advantageous to select the candidate Huffman codebook 6 for encoding each spectral data included in SFB0. Thus, the Huffman codebook 6 is selected.

Similarly, for SFB1, the code length would be 18 bits when encoding data with the Huffman codebook 5, and 13 bits when encoding data with the Huffman codebook 6. Therefore, it is more advantageous to also select the Huffman codebook 6 for encoding each spectral data included in SFB1. Thus, the Huffman codebook 6 is selected.

For SFB2 shown in FIG. 15, whose largest absolute spectral data value is 1, the Huffman codebooks 3–6 are the candidate Huffman codebooks. For the Huffman codebooks 5 and 6, the code length of Huffman-encoded data can be determined as described above; 9 bits for the Huffman codebook 5 and 8 bits for the Huffman codebook 6.

For the Huffman codebooks 3 and 4, the code length of Huffman-encoded data is calculated as follows. The Huffman codebooks 3 and 4 are so-called unsigned codebooks which are used for encoding data without a sign (unsigned data). When using an unsigned codebook, the absolute value of input data is Huffman-encoded, while the number of ignored signs are separately counted and added to the code amount of the Huffman encoding operation. The number of ignored signs corresponds to the number of non-zero elements (elements that require a sign) of the data to be encoded. The code length which would result when Huffman-encoding data with such an unsigned Huffman codebook can be obtained as follows.

First, an index value "index0" is calculated from Expression (3) below:

$$\text{index0} = abs(D0)*(k\hat{\ }3) + abs(D1)*(k\hat{\ }2) + abs(D2)*k + abs(D3) \quad (3)$$

where D0, D1, D2 and D3 respectively denote the four spectral data elements (values) of SFB2, "abs(x)" denotes an absolute value of x, "^" denotes an exponentiation, and k=LAV+1.

The calculated value of "index0" is used as the index value for obtaining "length" for each of Huffman codebooks 3 and 4. For SFB2 shown in FIG. 15, for example, D0=1, D1=−1, D2=1, D3=0 and LAV=2. Thus, index0=39. Referring to the Huffman codebook 3 shown in FIG. 16, a length=6 is determined for index0=39. Since the sign information bits are not included in the codeword obtained from the Huffman codebook 3, sign information is needed to restore the code bits. The number of sign information bits needed is equal to the number of non-zero elements among the four elements in the spectral data of SFB2. SFB2 shown in FIG. 15 includes three non-zero elements. Therefore, three sign information bits need to be added to the Huffman-encoded codeword. As a result, the code length of the Huffman-encoded data is 9 (bits) (length=6+three sign information bits).

Referring to the Huffman codebook 4 as shown in FIG. 17, a length=4 can be determined for index0=39. Again, three sign information bits need to be added to length=4. Therefore, the code length of the Huffman-encoded data is 7 (bits) (length=4+three sign information bits).

Thus, the code lengths which would result when Huffman-encoding SFB2 with the Huffman codebooks 3, 4, 5 and 6 are 9, 7, 9 and 8, respectively. Therefore, the Huffman-encoded 4 is selected, with which the smallest code length is obtained.

Similarly, the optimal Huffman codebook is selected and used for Huffman-encoding each of the other SFBs. The Huffman encoding operation, which is simple by itself, is effected by outputting as encoded data a codeword (hexadecimal) for each index number (e.g., index0, index1, etc., which can be obtained as described above) from the selected Huffman codebooks.

Then, for each SFB, the codebook number of the selected Huffman codebook is encoded. This operation of encoding a Huffman codebook number is performed as follows according to the MPEG2-AAC standard. The codebook number of the Huffman codebook selected for the SFB of interest is encoded with four bits. Then, a value indicating whether the same Huffman codebook is selected for any other SFB which is contiguous with the SFB of interest is encoded with five bits. In the example shown in FIG. 15, the Huffman codebook 6 is selected for contiguous SFBs (SFB0 and SFB1). Therefore, for SFB0, the codebook number of the Huffman codebook 6 (i.e., "6") is encoded with four bits (0110), and the value ("1") (which indicates that the same Huffman codebook is also selected for the following SFB (SFB1)) is encoded with five bits (00001). Next, for SFB2, the Huffman codebook 4 is selected. Therefore, the codebook number of the Huffman codebook 4 (i.e., "4") is encoded with four bits (0100). The following bit stream is dependent on the Huffman codebook selected for the following SFB (SFB3), and will not be discussed below. The codebook number of the selected Huffman codebook is similarly encoded for the subsequent SFBs.

A problem associated with the above-described conventional method is that the process of selecting the optimal Huffman codebook for each SFB takes a large amount of computation. This problem can be attributed in part to the calculation of the number of sign information bits, which is performed each time an unsigned codebook is selected. The problem can also be attributed to the operation of obtaining a code length which would result when encoding the SFB of interest with a Huffman codebook, which is performed separately for each of the candidate Huffman codebooks.

Another problem associated with the conventional method is that the method may not always select a Huffman codebook that is optimal for an SFB in view of the code amount needed to encode the codebook number of each selected Huffman codebook. In other words, the conventional method selects a Huffman codebook for each SFB so as to minimize the code amount of encoded data of that SFB. The conventional method cannot select the optimal Huffman codebook so as to minimize the total code amount of all encoded SFBs while taking into consideration the code amount needed to encode the codebook number of each selected Huffman codebook.

SUMMARY OF THE INVENTION

According to one aspect of this invention, there is provided an encoder including: a number G of storage sections (G is an integer equal to or greater than 1) for storing a number G of groups of data; a Huffman codebook selection section for selecting one of a number H of Huffman codebooks (H is an integer equal to or greater than 1) for each of the groups of data stored in the respective storage sections, each of the Huffman codebooks having a codebook number: a number G of Huffman encoding sections, each of the Huffman encoding sections Huffman-encoding a corresponding one of the G groups of data by using one of the Huffman codebooks which is selected by the Huffman codebook selection section for the one group of data: and a codebook number encoding section for encoding the codebook number of each Huffman codebook selected by the Huffman codebook selection section. The Huffman codebook selection section includes a code length calculation section for calculating a code length which would result from a Huffman encoding operation of each of the G groups of data using each Huffman codebook, and a control section for selecting one of the Huffman codebooks which is suitable for the group of data based on the code length calculated by the code length calculation section. When the Huffman codebook selected is an unsigned codebook, a number of bits required for sign information has previously been added to the code length calculated by the code length calculation section.

In one embodiment of the invention, the code length calculation section has a table of data including a code length previously calculated for each Huffman codebook.

According to another aspect of this invention, there is provided an encoder including: a number G of storage sections (G is an integer equal to or greater than 1) storing a number G of groups of data; a Huffman codebook selection section for selecting one of a number H of Huffman codebooks (H is an integer equal to or greater than 1) for each of the groups of data stored in the respective storage sections, each of the Huffman codebooks having a codebook number; a number G of Huffman encoding sections, each of the Huffman encoding sections Huffman-encoding a corresponding one of the G groups of data by using one of the Huffman codebooks which is selected by the Huffman codebook selection section for the one group of data; and a codebook number encoding section for encoding the codebook number of each Huffman codebook selected by the Huffman codebook selection section. The Huffman codebook selection section includes a code length calculation section for calculating a code length which would result from a Huffman encoding operation of each of the G groups of data using each Huffman codebook, and a control section for selecting one of the Huffman codebooks which is suitable for the group of data based on the code length calculated by the code length calculation section. The code length calculation section is capable of simultaneously obtaining code lengths for a plurality of Huffman codebooks.

In one embodiment of the invention, the code length calculation section is adapted to output respective code lengths which would result from Huffman encoding operations of the one group of data, for a plurality of Huffman codebooks. The control section selects one of the Huffman codebooks for which a smallest code length is output from the code length calculation section.

In one embodiment of the invention, the code length calculation section is adapted to output respective code lengths which would result from Huffman encoding operations of the one group of data, for a plurality of Huffman codebooks. The control section selects one of the Huffman codebooks based on the code length of the Huffman codebook output from the code length calculation section and in view of the codebook number of the Huffman codebook.

In one embodiment of the invention, the control section selects one of the Huffman codebooks for a $(g+1)^{th}$ group of data (g is an integer such that $1 \leq g \leq G-1$) by first obtaining a code length Bmin and another code length Bg, the code length Bmin being a code length which would result from a Huffman encoding operation of the $(g+1)^{th}$ group of data using a Huffman codebook Hmin for which a smallest code length is output from the code length calculation section, and the code length Bg being a code length which would result from a Huffman encoding operation of a $g^{th}$ group of data using a Huffman codebook Hg which has been selected for the $g^{th}$ group of data, and then selecting the Huffman codebook Hmin if Bmin<(Bg−A) (A is a predetermined integer) or the Huffman codebook Hg if Bmin≧(Bg−A).

In one embodiment of the invention, the control section selects one of the Huffman codebooks for which a smallest code length is output from the code length calculation section as a Huffman codebook for a first group of data.

In one embodiment of the invention, the control section selects one of the Huffman codebooks for a $(g-1)^{th}$ group of data (g is an integer such that $2 \leq g \leq G$) by first obtaining a code length Bmin and another code length Bg, the code length Bmin being a code length which would result from a Huffman encoding operation of the $(g-1)^{th}$ group of data using a Huffman codebook Hmin for which a smallest code length is output from the code length calculation section, and the code length Bg being a code length which would result from a Huffman encoding operation of a $g^{th}$ group of data using a Huffman codebook Hg which has been selected for the $g^{th}$ group of data, and then selecting the Huffman codebook Hmin if Bmin<(Bg−A) (A is a predetermined integer) or the Huffman codebook Hg if Bmin≧(Bg−A).

In one embodiment of the invention, the control section selects one of the Huffman codebooks for which a smallest code length is output from the code length calculation section as a Huffman codebook for a $G^{th}$ group of data.

In one embodiment of the invention, when a same Huffman codebook is selected for two or more contiguous groups of data, the codebook number encoding section encodes the codebook number of the Huffman codebook and the number of the contiguous groups of data with a number of bits equal to the predetermined integer A.

In one embodiment of the invention, the H Huffman codebooks are eleven Huffman codebooks used for Huffman-encoding of spectral data as defined in the MPEG2-AAC standard.

In one embodiment of the invention, the code length calculation section is adapted to output respective code lengths which would result when encoding data using Huffman codebooks 1–4 defined in the MPEG2-AAC standard. The code length calculation section has a first table including respective code lengths which would result when encoding data by using Huffman codebooks 1 and 2 for a common index value and a second table including respective code lengths which would result when encoding data by using Huffman codebooks 3 and 4 for the common index value.

In one embodiment of the invention, a number of bits required for sign information has previously been added to each of the code lengths for Huffman codebooks 3 and 4 which are included in the second table.

In one embodiment of the invention, the first table includes respective values of T1(F1(a, b, c, d)) and T2 (F1(a, b, c, d)) for i1, and the second table includes respective values of T3(F2(a, b, c, d))+nonz(a, b, c, d) and T4(F2(a, b, c, d))+nonz(a, b, c, d) for i2, where: nonz(w, x, y, z) is a function which gives the number of non-zero values among w, x, y and z; F1(w, x, y, z) is a function defined as follows: F1(w, x, y, z)=27*(w+1)+9*(x+1)+3*(y+1) +(z+1) (where an absolute value of each of w, x, y and z is 1 or less): F2(w, x, y, z) is a function defined as follows: F2(w, x, y, z)=27*abs(w)+9*abs(x)+3*abs(y)+abs(z) (where an absolute value of each of w, x, y and z is 2 or less); abs(x) is a function which gives an absolute value of x; T1(index) to T4(index) are each a function which gives a code length which would result when encoding data by using Huffman codebooks 1 to 4, respectively; a, b, c and d are integers representing a group of data; and i1 and i2 are index values calculated as a function of the integers a, b, c and d.

In one embodiment of the invention, i1=(X^3)*(a+1) +(X^2)*(b+1)+X*(c+1)+(d+1), where: X is a positive number equal to or greater than 3; i2=(Y^3)*abs(a)+(Y^2)*abs(b) +Y*abs(c)+abs(d), where: Y is a positive number equal to or greater than 3; and the symbol "^" denotes an exponentiation.

In one embodiment of the invention, the index value i1 is obtained through a bit connecting operation of a, b, c and d each of which is represented with X bits or more, where X is a positive number equal to or greater than 2. The index value i2 is obtained through a bit connecting operation of abs(a), abs(b), abs(c) and abs(d) each of which is represented with Y bits or more, where Y is a positive number equal to or greater than 2.

In one embodiment of the invention, the code length calculation section is adapted to output respective code lengths which would result when encoding data using Huffman codebooks 1–4 defined in the MPEG2-AAC standard.

The code length calculation section has a table of data including respective code lengths which would result when encoding data by using Huffman codebooks 1 to 4 for a common index value.

In one embodiment of the invention, a number of bits required for sign information has previously been added to each of the code lengths for Huffman codebooks 3 and 4 which are included in the table.

In one embodiment of the invention, the table includes respective values of T1(F1(a, b, c, d)), T2(F1(a, b, c, d)), T3(F2(a, b, c, d))+nonz(a, b, c, d) and T4(F2(a, b, c, d))+nonz(a, b, c, d) for j, where: nonz(w, x, y, z) is a function which gives the number of non-zero values among w, x, y and z; F1(w, x, y, z) is a function defined as follows: F1(w, x, y, z)=27*(w+1)+9*(x+1)+3*(y+1) +(z+1) (where an absolute value of each of w, x, y and z is 1 or less); F2(w, x, y, z) is a function defined as follows: F2(w, x, y, z)=27*abs(w)+9*abs(x)+3*abs(y)+abs(z) (where an absolute value of each of w, x, y and z is 2 or less); abs(x) is a function which gives an absolute value of x; T1(index) to T4(index) are each a function which gives a code length which would result when encoding data by using Huffman codebooks 1 to 4, respectively; a, b, c and d are integers representing a group of data; and j is an index value calculated as a function of the integers a, b, c and d.

In one embodiment of the invention, the index value j is obtained through a bit connecting operation of a, b, c and d each of which is represented with Y bits or more, where Y is a positive number equal to or greater than 2.

In one embodiment of the invention, the code length calculation section is adapted to output respective code lengths which would result when encoding data using Huffman codebooks 5–10 defined in the MPEG2-AAC standard. The code length calculation section has a first table including respective code lengths which would result when encoding data by using Huffman codebooks 5 and 6 for a common index value, a second table including respective code lengths which would result when encoding data by using Huffman codebooks 7 and 8 for a common index value, and a third table including respective code lengths which would result when encoding data by using Huffman codebooks 9 and 10 for a common index value.

In one embodiment of the invention, a number of bits required for sign information has previously been added to each of the code lengths for Huffman codebooks 7 and 8 which are included in the second table. A number of bits required for sign information has previously been added to each of the code lengths for Huffman codebooks 9 and 10 which are included in the third table.

In one embodiment of the invention, the first table includes respective values of T5(F3(a, b)) and T6(F3(a, b)) for i3, the second table includes respective values of T7(F4(a, b))+nonz(a, b) and T8(F4(a, b))+nonz(a, b) for i4, and the third table includes respective values of T9(F5(a, b))+nonz(a, b) and T10(F5(a, b))+nonz(a, b) for i5, where nonz(x, y) is a function which gives the number of non-zero values among x and y; F3(x, y) is a function defined as follows: F3(x, y)=9*(x+4)+(y+4) (where an absolute value of each of x and y is 4 or less); F4(x, y) is a function defined as follows: F4(x, y)=8*abs(x)+abs(y) (where an absolute value of each of x and y is 7 or less); F5(x, y) is a function defined as follows: F5(x, y)=13*abs(x)+abs(y) (where an absolute value of each of x and y is 12 or less); abs(x) is a function which gives an absolute value of x; T5(index) to T10(index) are each a function which gives a code length which would result when encoding data by using Huffman codebooks 5 to 10 defined in the MPEG2-AAC standard, respectively; a and b are integers representing a group of data; and i3, i4 and i5 are index values calculated as a function of the integers a and b.

In one embodiment of the invention, i3=X*(a+4)+(b+4), where X is a positive number equal to or greater than 9; i4=Y*abs(a)+abs(b), where Y is a positive number equal to or greater than 8: and i5=Z*abs(a)+abs(b), where Z is a positive number equal to or greater than 13.

In one embodiment of the invention, the index value i3 is obtained through a bit connecting operation of a and b each of which is represented with X bits or more, where X is a positive number equal to or greater than 4. The index value i4 is obtained through a bit connecting operation of a and b each of which is represented with Y bits or more, where Y is a positive number equal to or greater than 4. The index value i5 is obtained through a bit connecting operation of a and b each of which is represented with Z bits or more, where Z is a positive number equal to or greater than 5.

In one embodiment of the invention, the code length calculation section is adapted to output respective code lengths which would result when encoding data using Huffman codebooks 5–10 defined in the MPEG2-AAC standard. The code length calculation section has a table including respective code lengths which would result when encoding data by using Huffman codebooks 5 to 10 for a common index value.

In one embodiment of the invention, a number of bits required for sign information has previously been added to each of the code lengths for Huffman codebooks 7 to 10 which are included in the table.

In one embodiment of the invention, the table includes respective values of T5(F3(a, b)), T6(F3(a, b)), T7(F4(a, b))+nonz(a, b),T8(F4(a, b))+nonz(a, b),T9(F5(a, b))+nonz (a, b) and T10(F5(a, b))+nonz(a, b) fork, where: nonz(x, y) is a function which gives the number of non-zero values among x and y; F3(x, y) is a function defined as follows: F3(x, y)=9*(x+4)+(y+4) (where an absolute value of each of x and y is 4 or less); F4(x, y) is a function defined as follows: F4(x, y)=8*abs(x)+abs(y) (where an absolute value of each of x and y is 7 or less); F5(x, y) is a function defined as follows: F5(x, y)=13*abs(x)+abs(y) (where an absolute value of each of x and y is 12 or less); abs(x) is a function which gives an absolute value of x; T5(index) to T10(index) are each a function which gives a code length which would result when encoding data by using Huffman codebooks 5 to 10 defined in the MPEG2-AAC standard, respectively; a and b are integers representing a group of data: and k is an index value calculated as a function of the integers a and b.

In one embodiment of the invention, the index value k is obtained through a bit connecting operation of a and b each of which is represented with Z bits or more, where Z is a positive number equal to or greater than 5.

In one embodiment of the invention, the code length calculation section is adapted to output an invalid signal which indicates that a Huffman codebook is invalid when an input data value is outside a variable range within which a code length can be calculated using the Huffman codebook. The control section is adapted not to select a Huffman codebook when the control section receives an invalid signal for the Huffman codebook.

In one embodiment of the invention, the value of the function T1(F1(a, b, c, d)) and the value of the function T2(F1(a, b, c, d)) are stored respectively on a MSB side and on a LSB side with respect to the index value i1, with at least m1 bits of "0" (m1 is a positive integer) being inserted between the value of the function T1 and the value of the function T2. The value of the function T3(F2(a, b, c, d))+nonz(a, b, c, d) and the value of the function T4(F2(a, b, c, d))+nonz(a, b, c, d) are stored respectively on a MSB side and on a LSB side with respect to the index value i2, with at least m1 bits of "0" being inserted between the value of the function T3 and the value of the function T4.

In one embodiment of the invention, the value of the function T1(F1(a, b, c, d)), the value of the function T2(F1(a, b, c, d)), the value of the function T3(F2(a, b, c, d))+nonz(a, b, c, d) and the value of the function T4(F2(a, b, c, d))+nonz(a, b, c, d) are stored in this order from a MSB side to a LSB side with respect to the index value j, with at least m1 bits of "0" (m1 is a positive integer) being inserted between the value of T1 and the value of T2, between the value of T2 and the value of T3, and between the value of T3 and the value of T4.

In one embodiment of the invention, the value of m1 is an integer value obtained by rounding up a value of the logarithm of 2 to the base of n1 ($\log_2(n1)$), where n1 is a value obtained by dividing a maximum number of data included in each group among the G groups of data by 4.

In one embodiment of the invention, the value of the function T5(F3(a, b)) and the value of the function T6(F3(a, b)) are stored respectively on a MSB side and on a LSB side with respect to the index value i3, with at least m2 bits of "0" (m2 is a positive integer) being inserted between the value of the function T5 and the value of the function T6. The value of the function T7(F4(a, b))+nonz(a, b) and the value of the function T8(F4(a, b))+nonz(a, b) are stored respectively on a MSB side and on a LSB side with respect to the index value i4, with at least m2 bits of "0" being inserted between the value of the function T7 and the value of the function T8. The value of the function T9(F5(a, b))+nonz(a, b) and the value of the function T10(F5(a, b))+nonz(a, b) are stored respectively on a MSB side and on a LSB side with respect to the index value is, with at least m2 bits of "0" being inserted between the value of the function T9 and the value of the function T10.

In one embodiment of the invention, the value of the function T5(F3(a, b)), the value of the function T6(F3(a, b)), the value of the function T7(F4(a, b))+nonz(a, b), the value of the function T8(F4(a, b))+nonz(a, b), the value of the function T9(F5(a, b))+nonz(a, b) and the value of the function T10(F5(a, b))+nonz(a, b) are stored in this order from a MSB side to a LSB side with respect to the index value k, with at least m2 bits of "0" (m2 is a positive integer) being inserted between the value of T5 and the value of T6, between the value of T6 and the value of T7, between the value of T7 and the value of T8, between the value of T8 and the value of T9, and between the value of T9 and the value of T10.

In one embodiment of the invention, the value of m2 is an integer value obtained by rounding up a value of the logarithm of 2 to the base of n2 ($\log_2(n2)$), where n2 is a value obtained by dividing a maximum number of data included in each group among the G groups of data by 2.

Thus, the invention described herein makes possible the advantages of providing an encoder capable of selecting the optimal Huffman codebook from among a plurality of Huffman codebooks so as to encode digital data by using the optimally selected Huffman codebook. The encoder is also capable of selecting the optimal Huffman codebook within a reduced amount of time and efficiently encoding the digital data with a small amount of calculation.

This and other advantages of the present invention will become apparent to those skilled in the art upon reading and understanding the following detailed description with reference to the accompanying figures.

BRIEF DESCRIPTION OF THE DRAWINGS

FIG. 2 illustrates a table 200 stored in a table memory provided in a first code length calculator 114;

FIG. 3 illustrates a table 400 stored in a table memory provided in a second code length calculator 115;

FIG. 8 illustrates the contents of a table memory used for calculating respective code lengths for Huffman codebooks 1–4;

FIG. 10 illustrates the contents of a table memory used for calculating respective code lengths for Huffman codebooks 5–10;

FIG. 12 illustrates the contents of a table memory used for calculating respective code lengths for Huffman codebooks 5–10;

FIG. 13 illustrates a structure of a common table 1500 shown in FIG. 12;

FIG. 15 illustrates a table 500 of frequency spectral data which has been quantized and grouped into a number of SFBs;

FIG. 16 illustrates the contents of a first Huffman codebook 104 (Huffman codebook 3 of the MPEG2-AAC standard);

FIG. 17 illustrates the contents of a second Huffman codebook 105 (Huffman codebook 4 of the MPEG2-AAC standard);

FIG. 18 illustrates the contents of a third Huffman codebook 106 (Huffman codebook 5 of the MPEG2-AAC standard);

FIG. 19 illustrates the contents of a fourth Huffman codebook 107 (Huffman codebook 6 of the MPEG2-AAC standard); and FIG. 20 shows a table 1000 of spectrum Huffman codebook parameters used in an encoding scheme of the MPEG2-AAC standard.

DESCRIPTION OF THE PREFERRED EMBODIMENTS

Various embodiments of the present invention will now be described with reference to the accompanying drawings. The following embodiments are basically directed to an encoder for generating encoded data according to the MPEG2-AAC standard. While the MPEG2-AAC standard uses eleven Huffman codebooks, only four of the Huffman codebooks defined in the MPEG2-AAC standard (Huffman codebooks 3–6) are used for the sake of simplicity. Thus, in the following embodiments, a process of encoding quantized spectral data by using the Huffman codebooks 3–6 will be described in detail.

Embodiment 1

Figure 1:
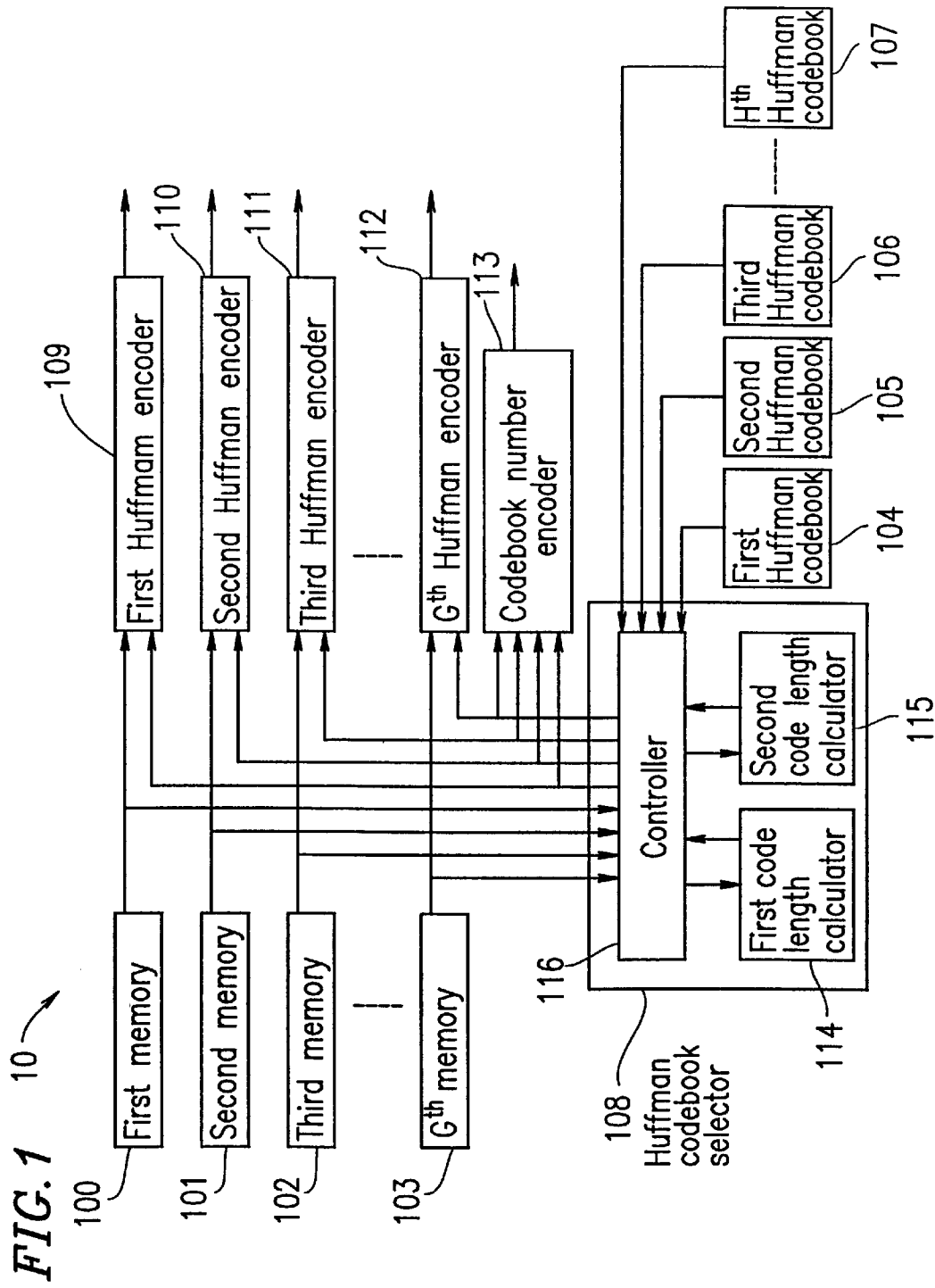
FIG. 1 is a block diagram illustrating a configuration of an encoder 10 of the present invention.

FIG. 1 illustrates a configuration of an encoder 10 according to Embodiment 1 of the present invention. The encoder 10 includes a number of "G" memories 100 to 103, a number of "H" Huffman codebooks 104 to 107, a Huffman codebook selector 108, a number of "G" Huffman encoders 109 to 112, and an codebook number encoder 113 (G and H are each an integer equal to or greater than 1).

A predetermined number of elements of spectral data are provided, each of which has been quantized. The elements of spectral data are grouped into a number of "G" "groups of data" (also referred to as "scale factor bands" or "SFBs"). These SFBs are stored in the memories 100 to 103, respectively. The SFBs stored in the memories 100 to 103 are input respectively to the Huffman encoders 109 to 112 and to the Huffman codebook selector 108.

The Huffman codebook selector 108 selects one of the "H" Huffman codebooks 104 to 107 which is suitable for each SFB. The Huffman codebook selector 108 outputs the contents of the selected Huffman codebooks to the Huffman encoders 109 to 112, respectively, and the codebook numbers of the selected Huffman codebooks to the codebook number encoder 113. The Huffman encoders 109 to 112 encode and output the SFBs stored in the memories 100 to 103 by using the respective Huffman codebooks selected by the Huffman codebook selector 108. The codebook number encoder 113 encodes and outputs the codebook number of each Huffman codebook selected.

The first memory 100 stores a first SFB (SFB0) among the "G" SFBs. Similarly, the second memory 101 stores a second SFB (SFB1), and the third memory 102 stores a third SFB (SFB2), and so on. Finally, the $G^{th}$ memory 103 stores the $G^{th}$ SFB (SFB(G−1)). The grouping of data is a known technique as done in an encoding method according to the MPEG2-AAC standard. As discussed in the description of the prior art, this can be done according to the table 450 of FIG. 14.

The "H" Huffman codebooks 104 to 107 are defined in the MPEG2-AAC standard for Huffman-encoding spectral data by an encoding scheme according to the MPEG2-AAC standard. As mentioned above, the number of "H" Huffman codebooks used in the embodiments to be described below is 4. The first to fourth Huffman codebooks 104 to 107 are defined as Huffman codebooks 3 to 6, respectively, in the MPEG2-AAC standard.

The Huffman codebook selector 108 is adapted to select one of the four Huffman codebooks 104 to 107 that is optimal for Huffman-encoding each of the SFBs stored in the "G" memories 100 to 103. The Huffman codebook selector 108 includes a first code length calculator 114, a second code length calculator 115 and a controller 116.

The first code length calculator 114 simultaneously calculates the code length (the number of bits) which would result from a Huffman encoding operation of one of the SFBs stored in the G memories 100 to 103 using the first Huffman codebook 104 (Huffman codebook 3) and that which would result from a Huffman encoding operation of the SFB using the second Huffman codebook 105 (Huffman codebook 4). Similarly, the second code length calculator 115 simultaneously calculates the code length which would result from a Huffman encoding operation of one of the SFBs stored in the G memories 100 to 103 using the third Huffman codebook 106 (Huffman codebook 5) and that which would result from a Huffman encoding operation of the SFB using the fourth Huffman codebook 107 (Huffman codebook 6). The controller 116 inputs each of the SFBs stored in the G memories 100 to 103 to one of the two code length calculators 114 and 115, and selects one of the Huffman codebooks that is optimal for a Huffman encoding operation of each SFB based on the outputs from the two code length calculators 114 and 115.

FIG. 2 shows a table 200 which is stored in a table memory provided for in the first code length calculator 114. The table 200 shows the code length or the number of bits (in the column "length of HCB3") which would result from a Huffman encoding operation of an input SFB using the first Huffman codebook 104 (Huffman codebook 3) and the code length or the number of bits (in the column "length of HCB4") which would result from a Huffman encoding operation of the SFB using the second Huffman codebook 105 (Huffman codebook 4), for each index value shown in the column "index" which is used as an address in the table 200. The index value is calculated as a function of the spectral data elements (values) contained in each input SFB.

FIG. 3 shows a table 400 which is stored in a table memory provided for in the second code length calculator 115. The table 400 shows the code length or the number of bits (in the column "length of HCB5") which would result from a Huffman encoding operation of an input SFB using the third Huffman codebook 106 (Huffman codebook 5) and the code length or the number of bits (in the column "length of HCB6") which would result from a Huffman encoding operation of the SFB using the fourth Huffman codebook 107 (Huffman codebook 6), for each index value shown in the column "index" which is used as an address in the table 400. Again, the index value is calculated as a function of the spectral data elements (values) contained in each input SFB.

The first Huffman encoder 109 (FIG. 1) Huffman-encodes the first group of spectral data (SFB0) by using a Huffman codebook optimally selected by the Huffman codebook selector 108 for the first group of spectral data (SFB0). Similarly, the second Huffman encoder 110 Huffman-encodes the second group of spectral data (SFB1) by using a Huffman codebook optimally selected for the second group of spectral data (SFB1), and so on. Finally, the $G^{th}$ Huffman encoder 112 Huffman-encodes the $G^{th}$ group of spectral data (SFB(G−1)) by using a Huffman codebook optimally selected for the $G^{th}$ group of spectral data (SFB(G−1)).

The codebook number encoder 113 encodes the codebook number of a Huffman codebook optimally selected by the Huffman codebook selector 108 for each SFB.

Next, the process of grouping input spectral data into SFBs and storing the SFBs into memories will be described.

Figure 14:
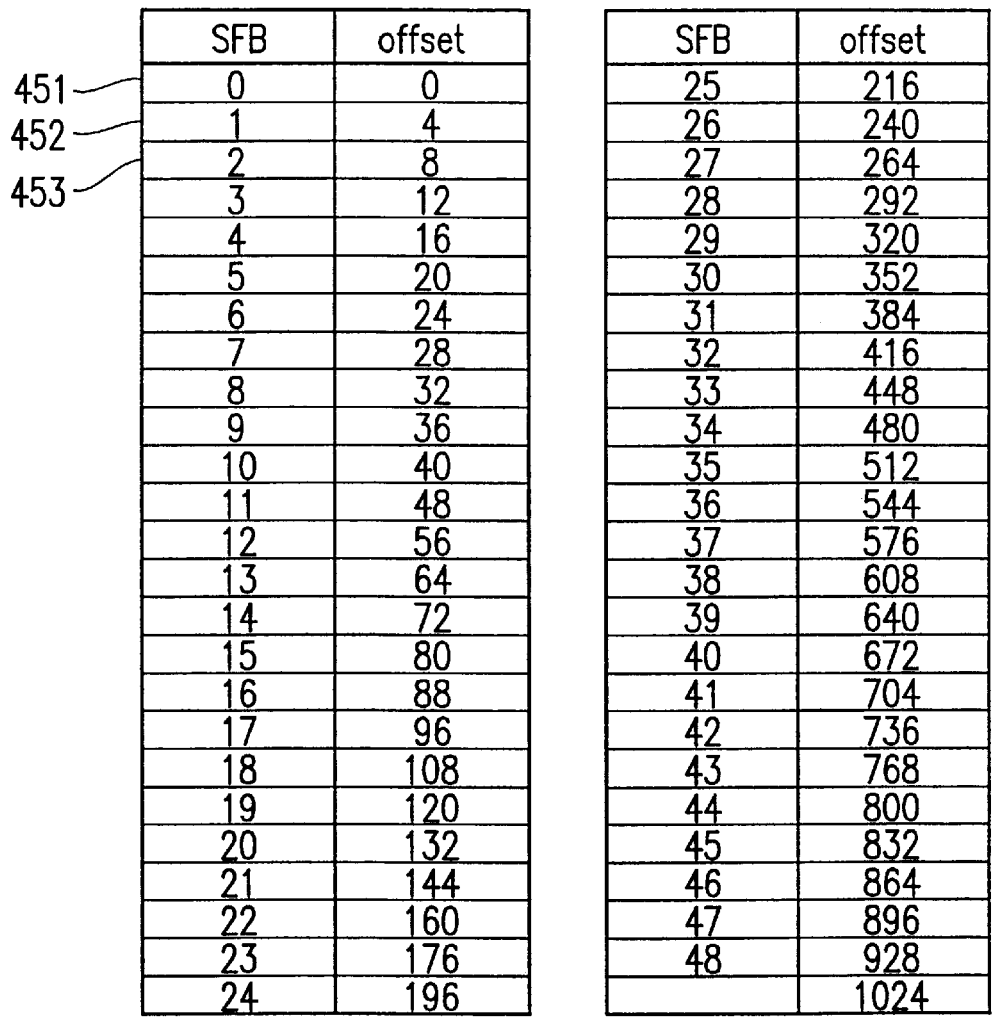
FIG. 14 illustrates a table 450 which defines grouping of quantized spectral data.

FIG. 14 shows the table 450 which defines the grouping of 1024 elements of quantized frequency spectral data into SFBs. The 1024 elements of quantized frequency spectral data are grouped into SFB0 to SFB48 as shown in FIG. 14. In FIG. 14, the left column "SFB" shows SFB numbers, and the right column "offset" shows the element number of the first spectral data element contained in each SFB. Note that the table is provided in 2 columns for spatial purposes.

The table 450 shown in FIG. 14 is used in a case where the sampling frequency is 48 kHz, so that the 1024 elements of quantized frequency spectral data are grouped into 49 SFBs (thus, G=49). Specifically, the first group of data (SFB0) contains four spectral data elements 0–3, the second group of data (SFB1) contains four spectral data elements 4–7, the third group of data (SFB2) contains four spectral data elements 8–11, and so on. The 49 SFBs are stored in 49 memories 100 to 103, respectively. For more details, see "ISO/IEC 13818-7 3.8 Tables".

FIG. 15 illustrates the table 500 of frequency spectral data which has been quantized and grouped into a number of SFBs (SFB0 to SFB(G−1)). In the table 500, the left column 501 "SFB" shows SFB numbers, and the center column 502 "spectrum" shows element numbers of the spectral data elements, and the right column 503 "value" shows the values of the respective spectral data elements. In FIG. 15, the row 550 corresponds to data of the first group (SFB0) stored in the first memory 100 (FIG. 1), the row 551 corresponds to data of the second group (SFB1) stored in the second memory 101, and the row 552 corresponds to data of the third group (SFB2) stored in the third memory 102.

Thus, the quantized spectral data is grouped into SFB0 to SFB(G−1), as shown in FIG. 15, which are then Huffman-encoded by the G Huffman encoders 109 to 112, respectively. Each SFB is Huffman-encoded based on one of the four Huffman codebooks 104 to 107 optimally selected for the SFB.

FIGS. 16 to 19 shows the contents of the first to fourth Huffman codebooks 104 to 107 which correspond to Huffman codebooks 3–6 defined in the MPEG2-AAC standard, respectively. As discussed in the description of the prior art, in each of the Huffman codebooks 3–6 shown in FIGS. 16 to 19, a column 300 "index" shows index values of data to be encoded, a column 301 "length" shows the code length (the number of bits) of encoded data for each index value, and a column 302 "codeword (hexadecimal)" shows encoded data (codeword) in a hexadecimal representation. Each of the Huffman codebooks 3–6 shown in FIGS. 16 to 19 shows the code length (the column 301 "length") and the hexadecimal representation (the column 302 "codeword") of encoded data for each of index values (the column 300 "index") ranging from 0 to 80.

Referring again to FIG. 1, the operation of the encoder 10 having a configuration as described above will now be described.

First, the controller 116 receives four spectral data elements from the first memory 100. The controller 116 selects one of the first code length calculator 114 and the second code length calculator 115 to which to output the received spectral data based on the largest absolute value (LAV) of the spectral data (one of the "spectrum Huffman codebook parameters"). As will be described below, according to the MPEG2-AAC standard, Huffman codebooks that can be selected for an input signal are limited by the largest absolute value of the input signal.

FIG. 20 shows a table 1000 of spectrum Huffman codebook parameters used in the encoding scheme of the MPEG2-AAC standard. The table 1000 contains various Huffman codebook attributes (or parameters) in a tabular form. In the table 1000, the leftmost column 1001 "Codebook Number, i" shows Huffman codebook numbers, the second column 1002 "unsigned_cb[i]" indicates whether the Huffman codebook is an unsigned codebook ("1") or a signed codebook ("0"), and the fourth column 1004 "LAV for codebook" shows the largest absolute value (LAV) of input data for which a Huffman codebook can be selected.

Referring to FIG. 15, the first group of spectral data (SFB0) has an LAV of 4. Therefore, it can be determined from the fourth column 1004 "LAV for codebook" in the table 1000 of FIG. 20 that the third Huffman codebook 106 (Huffman codebook 5 of the MPEG2-AAC standard) and the fourth Huffman codebook 107 (Huffman codebook 6 of the MPEG2-AAC standard) are candidates for SFB0.

Therefore, the controller 116 inputs the group of spectral data received from the first memory 100 (SFB0) to the second code length calculator 115, which stores code length data for the third and fourth Huffman codebooks 106 and 107. The second code length calculator 115 operates as follows. First, the second code length calculator 115 calculates two index values "index0" and "index1" to be used as addresses in the table 400 shown in FIG. 3 as shown in Expressions (4) and (5) below:

$$\text{index0} = (D0+LAV)*(2*LAV+1)+(D1+LAV) \quad (4)$$

$$\text{index1} = (D2+LAV)*(2*LAV+1)+(D3+LAV) \quad (5)$$

where D0, D1, D2 and D3 respectively denote the four spectral data elements (values) of the input group of data (SFB0).

Once the index values "index0" and "index1" are calculated, the second code length calculator 115 obtains from the table 400 shown in FIG. 3 the code length (the number of bits) which would result from a Huffman encoding operation of SFB0 using the third Huffman codebook 106 (Huffman codebook 5) and that which would result from a Huffman encoding operation of SFB0 using the fourth Huffman codebook 107 (Huffman codebook 6).

In the table 400 shown in FIG. 3, the left column 401 labeled "index" shows the index value which is used as an address in the table 400, the center column 402 labeled "length of HCB5" shows the code length which would result from a Huffman encoding operation of an input SFB using the third Huffman codebook 106 (Huffman codebook 5), and the right column 403 labeled "length of HCB6" shows the code length which would result from a Huffman encoding operation of an input SFB using the fourth Huffman codebook 107 (Huffman codebook 6).

The Huffman codebooks 5 and 6 stored in the second code length calculator 115 are each a signed codebook which is used to Huffman-encode signed data. Therefore, in the table 400 shown in FIG. 3, the columns 402 and 403 ("length of HCB5" and "length of HCB6") each shows the number of bits corresponding to the code length which would result from a Huffman encoding operation of each SFB.

Thus, by using the table 400 shown in FIG. 3, it is possible to obtain, for one index value, the code length which would result from a Huffman encoding operation using Huffman codebook 5 and the code length which would result from a Huffman encoding operation using Huffman codebook 6.

In the first group of spectral data (SFB0) shown in FIG. 15, the spectral data elements respectively have values as follows: D0=4, D1=−2, D2=0 and D3=3. Thus, LAV=4. Therefore, index0=74 and index1=43. Referring to the table 400 of FIG. 3, for index0=74, the code length ("length of HCB5") which would result when encoding SFB0 using the Huffman codebook 5 is 12 bits and the code length ("length of HCB6") which would result when encoding SFB0 using the Huffman codebook 6 is 9 bits. For index1=43, the code length ("length of HCB5") which would result when encoding SFB0 using the Huffman codebook 5 is 8 bits and the code length ("length of HCB6") which would result when encoding SFB0 using the Huffman codebook 6 is 7 bits.

Thus, the second code length calculator 115 calculates two index values "index0" and "index1" for an input group of data (SFB0 in this example), and obtains the code length which would result when encoding SFB0 using Huffman codebook 5 and the code length which would result when encoding SFB0 using Huffman codebook 6. Then, the second code length calculator 115 calculates the sum of two code lengths (one for index0 and another for index1) for each of the Huffman codebooks 5 and 6. In this example, the total code length for Huffman codebook 5 is 20 (12+8) bits, and the total code length for Huffman codebook 6 is 16 (9+7) bits. The calculated total code length (the number of bits) for each Huffman codebook is output to the controller 116.

Then, the controller 116 selects one of the Huffman codebooks 5 and 6 based on the total code length for each of the Huffman codebook 5 and 6 output from the second code length calculator 115. Thus, in this example, the Huffman codebook 6, which would give a smaller code length for SFB0, is selected.

One of the Huffman codebook 5 and 6 is selected from the second group of spectral data (SFB1) shown in FIG. 15 which is stored in the second memory 101 in a manner similar to that for the first group of spectral data (SFB0). Since LAV=4 for SFB1, the controller 116 again selects the second code length calculator 115 as for SFB0, and the second code length calculator 115 operates in a manner similar to that described above for SFB0. Then, the second code length calculator 115 outputs to the controller 116 the code length which would result when encoding SFB1 using Huffman codebook 5 (18 bits in this example), and the code length which would result when encoding SFB1 using Huffman codebook 6 (13 bits in this example). Thus, the controller 116 selects the Huffman codebook 6, which would give a smaller code length for SFB1.

Then, the controller 116 receives the third group of spectral data (SFB2), as shown in FIG. 15, from the third memory 102. For the third group of spectral data (SFB2), LAV=1. Referring to the column 1004 "LAV for codebook" of the table 1000 shown in FIG. 20, it is indicated that Huffman codebooks 3 and 4, which are unsigned codebooks, and Huffman codebook 5 and 6, which are signed codebooks, can be selected for SFB2. Therefore, the controller 116 outputs the received group of spectral data (SFB2) both to the first code length calculator 114, which contains data for Huffman codebooks 3 and 4, and to the second code length calculator 115, which contains data for Huffman codebook 5 and 6.

The second code length calculator 115 obtains from the table 400 shown in FIG. 3 the code length which would result from a Huffman encoding operation using each of the Huffman codebook 5 and 6, in a manner similar to that described above. The process of obtaining the code length is as described above and will not be further described below. The calculated code length which would result when encoding SFB2 using Huffman codebook 5 is 9 bits and the code length which would result when encoding SFB2 using Huffman codebook 6 is 8 bits.

The first code length calculator 114 operates as follows to calculate the code length (the number of bits) which would result from a Huffman encoding operation of SFB2 using each of Huffman codebooks 3 and 4. First, the first code length calculator 114 receives from the controller 116 the four spectral data elements contained in the third group of spectral data (SFB2) stored in the third memory 102. Then, the first code length calculator 114 calculates one index value "index0" according to Expression (6) below:

$$\text{index0} = abs(D0) * (k\hat{\ }3) + abs(D1) * (k\hat{\ }2) + abs(D2) * k + abs(D3) \quad (6)$$

where D0, D1, D2 and D3 respectively denote the four spectral data elements (values) of SFB2, "abs(x)" denotes an absolute value of x, "^" denotes an exponentiation, and k=LAV+1.

Once the index value "index0" is calculated, the first code length calculator 114 obtains from the table 200 shown in FIG. 2 the code length (the number of bits) which would result from a Huffman encoding operation of SFB2 using the first Huffman codebook 104 (Huffman codebook 3) and that which would result from a Huffman encoding operation of SFB2 using the second Huffman codebook 105 (Huffman codebook 4), based on the calculated index value "index0".

In the table 200 of FIG. 2, the left column 201 labeled "index" shows the index value which is used as an address in the table 200, the center column 202 labeled "length of HCB3" shows the code length (the number of bits) which would result from a Huffman encoding operation of an input SFB using the first Huffman codebook 104 (Huffman codebook 3), and the right column 203 labeled "length of HCB4" shows the code length (the number of bits) which would result from a Huffman encoding operation of an input SFB using the second Huffman codebook 105 (Huffman codebook 4). Thus, by using the table 200 shown in FIG. 2, it is possible to obtain the code length (the number of bits) which would result from a Huffman encoding operation using Huffman codebook 3 and the code length which would result from a Huffman encoding operation using Huffman codebook 4, for one index value.

The table 200 of FIG. 2 contains the code length (the number of bits) which would result from a Huffman encoding operation using each of Huffman codebooks 3 and 4, which are defined in the MPEG2-AAC standard, for each index value. However, referring to the table 1000 of FIG. 20, the column 1002 "unsigned_cb [i]" shows "1" for both of the Huffman codebooks 3 and 4, indicating that the Huffman codebooks 3 and 4 are unsigned codebooks. Therefore, the column 202 "length of HCB3" contains the sum of the code length (the number of bits) which would result from a Huffman encoding operation using the Huffman codebook 3 defined in the MPEG2-AAC standard and the number of non-zero values (i.e., values which require sign information bits) contained in the input group of spectral data. The same applies to the column 203 "length of HCB4".

In SFB2 as shown in FIG. 15, the spectral data elements respectively have values as follows: D0=1, D1=−1,D2=1 and D3=0. Thus, LAV=2. Therefore, index0=39. Referring to the table 200 of FIG. 2, for index0=39, the column 202 "length of HCB3" (the sum of the code length which would result from a Huffman encoding operation using the Huffman codebook 3 and the number of non-zero values) shows a value of 9, and the column 203 "length of HCB4" (the sum of the code length which would result from a Huffman encoding operation using the Huffman codebook 4 and the number of non-zero values) shows a value of 7.

Then, the first code length calculator 114 outputs to the controller 116 the code length which would result when encoding SFB2 using Huffman codebook 3 (9 bits in this example), and the code length which would result when encoding SFB2 using Huffman codebook 4 (7 bits in this example). Similarly, the second code length calculator 115 outputs to the controller 116 the code length which would result when encoding SFB2 using Huffman codebook 5 (9 bits in this example), and the code length which would result when encoding SFB2 using Huffman codebook 6 (8 bits in this example). The controller 116 selects one of the Huffman codebooks based on the outputs from the first and second code length calculators 114 and 115. In this example, the controller 116 selects the Huffman codebook 4, which would give a smaller code length for SFB2.

In the process of obtaining the code length which would result from a Huffman encoding operation of the third group of spectral data (SFB2) stored in the third memory 102, the controller 116 may activate the first code length calculator 114 and the second code length calculator 115 either in parallel or in series. Where the Huffman codebook selector 108 is implemented by software, the code length calculators 114 and 115 will likely be activated in series. However, where the Huffman codebook selector 108 is implemented by hardware, the code length calculators 114 and 115 are activated preferably in parallel so as to realize a high-speed process.

Similarly, the Huffman codebook selector 108 selects an optimal Huffman codebook for each of the G groups of spectral data (SFBs), and each of the groups of spectral data (SFBs) is Huffman-encoded by a corresponding one of the Huffman encoders 109 to 112 using the Huffman codebook selected for the group of spectral data (SFB). The Huffman encoding operation itself is similar to the conventional Huffman encoding operation, and is performed by outputting as encoded data a codeword from the column "codeword" of the selected Huffman codebook for the calculated index value (e.g., "index0", "index1", etc.).

Then, the codebook number of each Huffman codebook selected for a group of spectral data (SFB) is encoded by the codebook number encoder 113. According to the MPEG2-AAC standard, the codebook number of each Huffman codebook selected for a group of spectral data (SFB) is encoded with four bits. When the same Huffman codebook is selected for two or more contiguous groups of spectral data (SFBs), the number of the contiguous groups of spectral data (SFBs) is encoded with five bits.

In the example shown in FIG. 15, the Huffman codebook 6 is selected for both SFB0 and SFB1. Therefore, the codebook number of the Huffman codebook 6 (i.e., "6") is first encoded with four bits (0110), and then the value "1" (which indicates that there is another SFB (SFB1) in addition to the SFB of interest (SFB0) for which the Huffman codebook 6 is selected) is encoded with five bits (00001). Next, for SFB2, the Huffman codebook 4 is selected. Therefore, the codebook number of the Huffman codebook 4 (i.e., "4") is encoded with four bits (0100). The following bit stream is dependent on the Huffman codebook selected for the following SFB (SFB3). The codebook number of the selected Huffman codebook is similarly encoded for the subsequent SFBs.

As described above, according to the present embodiment, it is possible to simultaneously obtain code lengths which would result from Huffman encoding operations for different Huffman codebooks. Moreover, even when the selected Huffman codebook is an unsigned codebook, it is possible to obtain from a single table the sum of the code length which would result from a Huffman encoding operation using the selected Huffman codebook and the number of bits required for sign information. Thus, it is possible to substantially reduce the amount of computation required for the Huffman encoding operation.

Embodiment 2

Embodiment 2 of the present invention will now be described. The configuration and operation of the encoder and the grouping of the spectral data are similar to those described above in Embodiment 1, and thus will not be further described below.

In Embodiment 1, the controller 116 receives the output values from the first and second code length calculators 114 and 115, and selects a Huffman codebook for which the output value is smallest. On the contrary, according to Embodiment 2, the controller 116 selects a Huffman codebook in view of not only the code length which would result when Huffman-encoding data of interest, but also the code length which would result from an encoding operation of the codebook number of the selected Huffman codebook, so that the total code length of the output data is minimized.

Specifically, such a Huffman codebook selection is made as follows. First, for the $(g+1)^{th}$ group of data (g is an integer such that $1 \leq g \leq G-1$), a code length Bmin and another code length Bg are obtained. The code length Bmin is a code length which would result from a Huffman encoding operation of the $(g+1)^{th}$ group of data using a Huffman codebook Hmin (i.e., a Huffman codebook for which the code length would be smallest), and the code length Bg is a code length which would result from a Huffman encoding operation of the $(g+1)^{th}$ group of data using a Huffman codebook Hg (i.e., a Huffman codebook which has been selected for the $g^{th}$ group of data). Then, the Huffman codebook Hmin is selected if Bmin<(Bg−A) (A is a predetermined integer, e.g., 9), and the Huffman codebook Hg is selected if Bmin≧(Bg−A). In the present embodiment, for example, the codebook number of a selected Huffman codebook is encoded with four bits, and the number of SFBs for which the same Huffman codebook is selected is encoded with five bits. As a result, a total of 9 bits are used for the selected Huffman codebook. Thus, 9 is set as the value of A.

The encoding scheme according to the MPEG2-AAC standard encodes not only the Huffman-encoded data but also the codebook number of the selected Huffman codebook. Therefore, the encoding process can be performed efficiently by reducing the sum of the total number of bits used to represent the code length which would result from a Huffman encoding operation and the total number of bits needed to encode the codebook number of the selected Huffman codebook. Thus, for an SFB, it may be more advantageous to select a Huffman codebook which is also selected for an adjacent SFB, even if that Huffman codebook would not minimize the code length of Huffman-encoded data for that SFB, so as to minimize the total length.

In an encoding scheme according to the MPEG2-AAC standard, a predetermined number A of bits are used to encode the codebook number of a Huffman codebook selected for an SFB of interest and the value which indicates whether the same Huffman codebook is selected for one or more SFBs which are contiguous to the SFB of interest. In Embodiment 1 above, the value of A is 9 (4 bits for encoding the codebook number of the Huffman codebook plus 5 bits for encoding the number of contiguous groups of data (SFBs) for which the same Huffman codebook is selected. Therefore, when the Huffman codebook used for the $(g+1)^{th}$ group of data is different from the Huffman codebook used for the $g^{th}$ group of data adjacent to the $(g+1)^{th}$ group of data, a number A of extra bits will be required to encode the codebook number. In view of this, in Embodiment 2, a Huffman codebook is selected based on a comparison between Bmin and (Bg−A).

A method according to Embodiment 2 for selecting a Huffman codebook where quantized and grouped spectral data is stored in memories as shown in FIG. 15 will now be described. Herein, it is assumed A=9. The method for obtaining the code length which would result from a Huffman encoding operation is similar to that described above in Embodiment 1, and thus will not be further described below.

First, for the first group of spectral data (SFB0), the Huffman codebook 6, for which the smallest code length is output from a code length calculator, is selected as in Embodiment 1. For the second group of spectral data (SFB1), the number of bits corresponding to the code length for the Huffman codebook which gives the smallest code length is compared to the number of bits corresponding to the code length for the Huffman codebook selected for the adjacent first group of spectral data (SFB0). In this example, the Huffman codebook 6 gives the smallest code length both for the second group (SFB1) and for the adjacent first group (SFB0). Therefore, the Huffman codebook 6 is selected for the second group (SFB1) without having to make the comparison in the number of bits.

For the third group (SFB2), the number of bits corresponding to the code length for the Huffman codebook which gives the smallest code length is compared to the number of bits corresponding to the code length which would result when encoding SFB2 using the Huffman codebook 6, which is selected for the adjacent second group (SFB1). The code length for the Huffman codebook 4, which is selected for the third group (SFB2) because Huffman codebook 4 would give the smallest code length for SFB2, is 7 bits, and the code length for the Huffman codebook 6 which is selected for the adjacent second group (SFB1) is 8 bits. Therefore, Bmin=7 and Bg=8. Thus, (Bg−A)=(8−9), and Bmin≧(Bg−A) holds. Therefore, the controller 116 selects the Huffman codebook 6 which is selected for the adjacent second group (SFB1).

Thus, in this example, the Huffman codebook 6 is selected for the first group (SFB0), the second group (SFB1) and the third group (SFB2). Therefore, the codebook number encoder 113 encodes the codebook number of the Huffman codebook 6 (i.e., "6") with 4 bits (0110), and encodes the value "2" (which indicates that the same Huffman codebook 6 is selected for three contiguous groups (SFBs)) with five bits (00010). The codebook number of the Huffman codebook selected for the three groups of spectral data (SFB0 to SFB2) is encoded as described above.

In the above-described embodiments, the Huffman codebook selection is performed for a number of SFBs in an ascending order, i.e., from a smaller SFB number to a larger SFB number. Alternatively, the Huffman codebook selection may be performed in a descending order of SFBs, as follows.

First, for the $(g-1)^{th}$ group of data (g is an integer such that 2≦g≦G), a code length Bmin and another code length Bg are obtained. The code length Bmin is a code length which would result from a Huffman encoding operation of the $(g-1)^{th}$ group of data using a Huffman codebook Hmin (i.e., a Huffman codebook for which the code length would be smallest) which is selected based on the outputs from the first code length calculator 114 or the second code length calculator 115, and the code length Bg is a code length which would result from a Huffman encoding operation of the $(g-1)^{th}$ group of data using a Huffman codebook Hg (i.e., a Huffman codebook which has been selected for the $g^{th}$ group of data). Then, the Huffman codebook Hmin is selected if Bmin<(Bg−A) (A is a predetermined integer, e.g., 9), and the Huffman codebook Hg is selected if Bmin≧(Bg−A).

For the $G^{th}$ group, the controller 116 selects one Huffman codebook based on the output from the first code length calculator 114 and the output from the second code length calculator 115 by which the code length which would result from a Huffman encoding operation is the smallest.

Alternatively, a Huffman codebook for each SFB may be selected based on a comparison between the total code length for the SFBs which would result when the Huffman codebook selection is performed in the ascending order and that for the same SFBs which would result when the Huffman codebook selection is performed in the descending order.

As described above, the present embodiment provides an advantage, in addition to those of Embodiment 1, in that the code length required for encoding the codebook number of each selected Huffman codebook can be reduced, thereby realizing a more efficient Huffman encoding operation.

In Embodiments 1 and 2 above, the first and second code length calculators 114 and 115 may be adapted to output an invalid signal which indicates that a Huffman codebook is invalid when an input data value is outside a variable range within which a code length can be calculated using the Huffman codebook. In such a case, the controller 116 is adapted not to select a Huffman codebook when the controller 116 receives the invalid signal for the Huffman codebook.

In the above description of Embodiments 1 and 2, it is assumed for the sake of simplicity that a Huffman codebook is selected from among only four Huffman codebooks 3–6. It is noted, however, that the actual MPEG2-AAC standard provides eleven Huffman codebooks 1–11 among which a Huffman codebook can be selected and used for a Huffman encoding operation.

Figure 4:
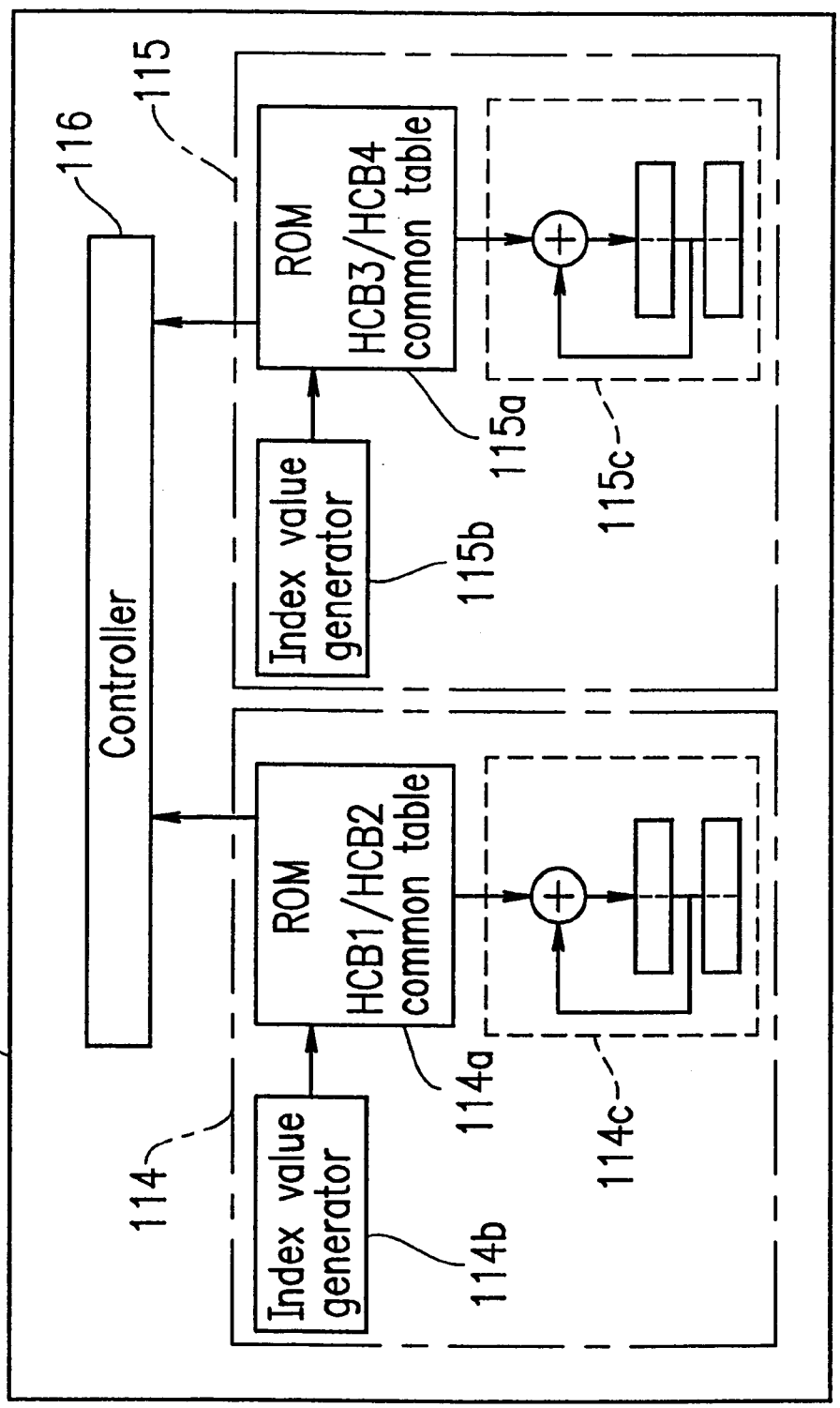
FIG. 4 illustrates a configuration of a Huffman codebook selector 108 for selecting one of Huffman codebooks 1–4.

FIG. 4 illustrates a configuration of the Huffman codebook selector 108 for selecting one of Huffman codebooks 1–4. The Huffman codebook selector 108 includes the controller 116, the first code length calculator 114 and the second code length calculator 115. The first code length calculator 114 includes a ROM 114a having a first table ("HCB1/HCB2 common table") including respective code lengths which would result when encoding data by using Huffman codebooks 1 and 2 for a common index value. The second code length calculator 115 includes a ROM 115a having a second table ("HCB3/HCB4 common table") including respective code lengths which would result when encoding data by using Huffman codebooks 3 and 4 for a common index value.

The first code length calculator 114 can obtain respective code lengths for the Huffman codebooks 1 and 2 from the first table provided in the ROM 114a based on the index value generated by an index value generator 114b. Similarly, the second code length calculator 115 can obtain respective code lengths for the Huffman codebooks 3 and 4 from the second table provided in the ROM 115a based on the index value generated by an index value generator 115b.

Since the Huffman codebooks 3 and 4 are unsigned codebooks, a number of bits required for sign information has previously been added to the code length which is set in the second table provided in the ROM 115a.

The first code length calculator 114 further includes an accumulator 114c for accumulating as-retrieved table data (i.e., without dividing the retrieved data into smaller segments) from the HCB1/HCB2 common table stored in the ROM 114a. The principle based on which as-retrieved table data can be accumulated will be described later. The second code length calculator 115 further includes an accumulator 115c which is similar to the accumulator 114c.

The index value generator 114b generates an index value i1 based on Expression (7) below:

$$i1=(X^3)*(a+1)+(X^2)*(b+1)+X*(c+1)+(d+1) \quad (7)$$

where X is a positive number equal to or greater than 3, and a, b, c and d are four adjacent spectral data elements.

The index value generator 115b generates an index value i2 based on Expression (8) below:

$$i2=(Y^3)*abs(a)+(Y^2)*abs(b)+Y*abs(c)+abs(d) \quad (8)$$

where Y is a positive number equal to or greater than 3, and a, b, c and d are four adjacent spectral data elements.

Then, the code length (the number of bits) which would result from a Huffman encoding operation using each of Huffman codebooks 1–4 is obtained from the tables provided in the ROM 114a and the ROM 115a based on the generated index values i1 and i2, respectively.

Figure 5:
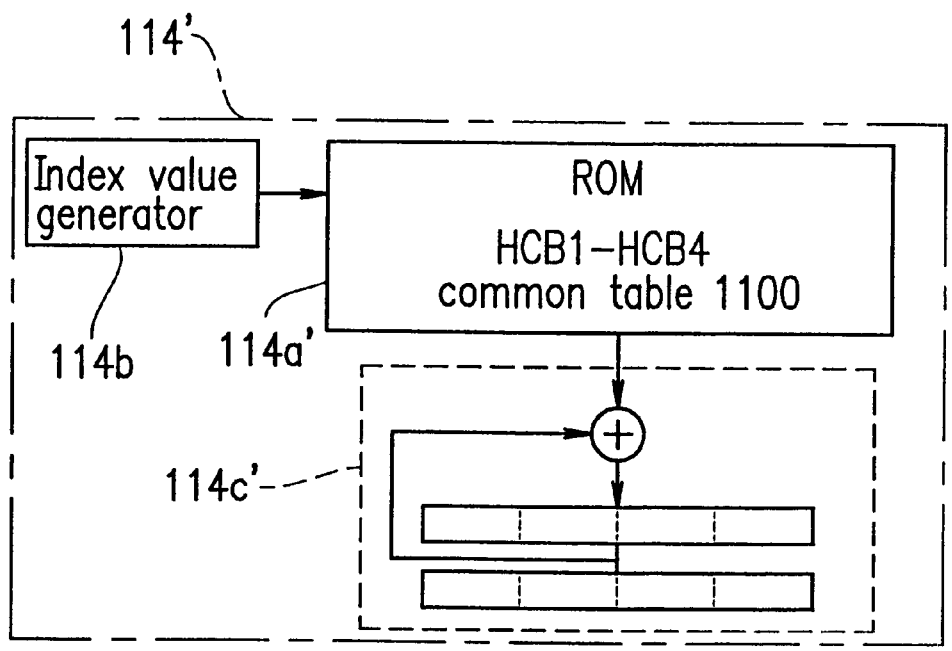
FIG. 5 illustrates a configuration of an alternative first code length calculator 114' for calculating the code length which would result when using Huffman codebooks 1–4.

FIG. 5 illustrates an alternative first code length calculator 114' for calculating the code length which would result when using Huffman codebooks 1–4. The first code length calculator 114' includes the index value generator 114b, and the ROM 114a' having a single table ("HCB1–HCB4 common table 1100") which contains respective code lengths which would result from a Huffman encoding operation using each of the Huffman codebooks 1–4 for a common index value.

The first code length calculator 114' further includes an accumulator 114c' for accumulating as retrieved table data (i.e., without dividing the retrieved data into smaller segments) from the HCB1–HCB4 common table 1100 stored in the ROM 114a'. The accumulator 114c' may be, for example, a 32-bit accumulator.

The index value generator 114b generates an index value through a bit connecting operation of four adjacent spectral data elements a, b, c and d each of which is represented with Y bits or more, where Y is a positive number equal to or greater than 2. For example, where Y is 2, an index value j is generated based on Expression (9) below:

$$j=((a\&3)<<6)|((b\&3)<<4)|((c\&3)<<2)|(d\&3) \qquad (9)$$

where "&" denotes a logical addition, and "<<" denotes a bit shift operation.

The respective code lengths which would result from a Huffman encoding operation using each of the Huffman codebooks 1–4 are obtained from the HCB1–HCB4 common table 1100 stored in the ROM 114a' based on the generated index value j.

Figure 6:
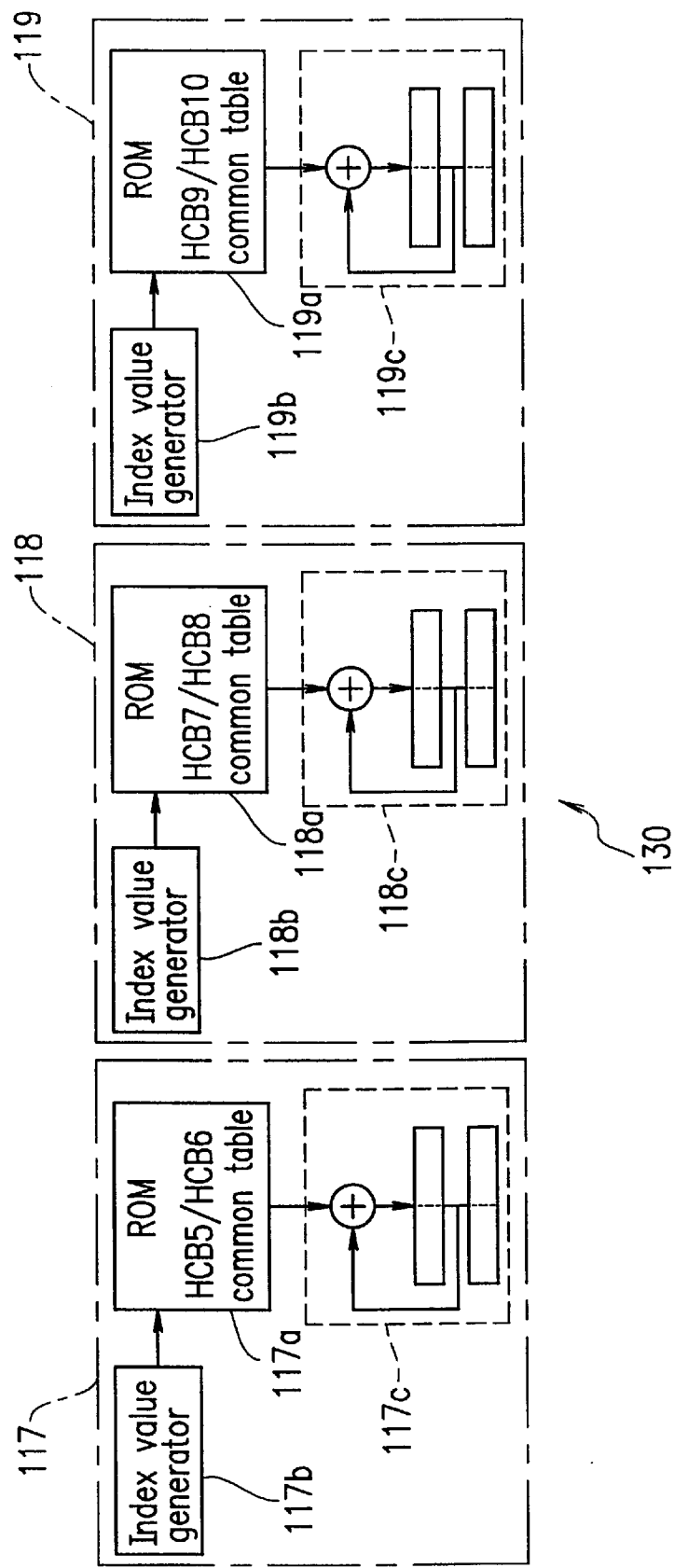
FIG. 6 illustrates a configuration of a code length calculator 130 for calculating the code length which would result when using Huffman codebooks 5–10.

FIG. 6 illustrates a configuration of a code length calculator 130 for calculating the code length which would result when using Huffman codebooks 5–10. The code length calculator 130 includes code length calculators 117, 118 and 119. The code length calculators 117, 118 and 119 include ROMs 117a, 118a and 119a, respectively. The ROM 117a has a first table including respective code lengths which would result when encoding data by using Huffman codebooks 5 and 6 for a common index value. The ROM 118a has a second table including respective code lengths which would result when encoding data by using Huffman codebooks 7 and 8 for a common index value. The ROM 119a has a third table including respective code lengths which would result when encoding data by using Huffman codebooks 9 and 10 for a common index value. The code lengths contained in the tables in the ROMs 117a to 119a are obtained based on index values which are generated by index value generators 117b to 119b.

As indicated in FIG. 20, the Huffman codebooks 7–10 are unsigned codebooks. Therefore, a number of bits required for sign information has previously been added to the code length which is set in the tables provided in the ROMs 118a and 119a.

The code length calculator 117 further includes an accumulator 117c for accumulating as-retrieved table data (i.e., without dividing the retrieved data into smaller segments) from the HCB5/HCB6 common table stored in the ROM 117a.

The index value generator 117b generates the index value i3 based on Expression (10) below:

$$i3=(X)*(a+4)+(b+4) \qquad (10)$$

where X is a positive number equal to or greater than 9, and a and b are two adjacent spectral data elements.

The index value generator 118b generates the index value i4 based on Expression (11) below:

$$i4=(Y)*abs(a)+abs(b) \qquad (11)$$

where Y is a positive number equal to or greater than 8, and a and b are two adjacent spectral data elements.

The index value generator 119b generates the index value i5 based on Expression (12) below:

$$i5=(Z)*abs(a)+abs(b) \qquad (12)$$

where Z is a positive number equal to or greater than 13, and a and b are two spectral data elements.

The respective code lengths which would result when encoding data by using Huffman codebooks 1–4 are obtained from the tables provided in the ROMs 117a to 119a based on the generated index values i3, i4 and i5.

Figure 7:
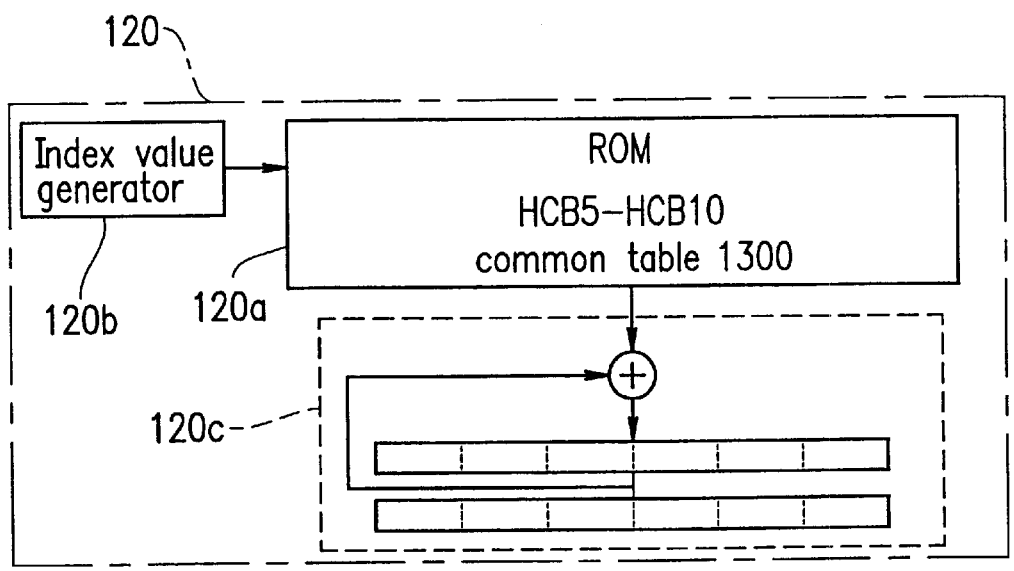
FIG. 7 illustrates a configuration of an alternative code length calculator 120 for calculating the code length which would result when using Huffman codebooks 5–10.

FIG. 7 illustrates a configuration of a code length calculator 120 for calculating the code length which would result when using the Huffman codebooks 5–10. The code length calculator 120 includes a ROM 120a containing a single table ("HCB5–HCB10 common table 1300") which contains respective code lengths which would result from a Huffman encoding operation using each of the Huffman codebooks 5–10 for a common index value.

The code length calculator 120 further includes an accumulator 120c for accumulating as-retrieved table data (i.e., without dividing the retrieved data into smaller segments) from the HCB5–HCB10 common table 1300 stored in the ROM 120a. The accumulator 120c may be, for example, a 48-bit accumulator.

The code length calculator 120 includes an index value generator 120b for generating an index value k through a bit connecting operation of two adjacent spectral data elements a and b each of which is represented with Z bits or more, where Z is a positive number equal to or greater than 5. Where Z is 5, the code length calculator 120 generates the index value k based on Expression (13) below:

$$k=((a\&31)<<5)|(b\&31) \qquad (13).$$

The respective code lengths which would result when encoding data by using Huffman codebooks 5–10 are obtained from the HCB5–HCB10 common table 1300 provided in the ROM 120a based on the generated index value k.

An actual table memory provided in an actual code length calculator will now be described.

FIG. 8 illustrates the contents of the table memory (the HCB1–HCB4 common table 1100) used for calculating the respective code lengths for the Huffman codebooks 1–4. Each of the Huffman codebooks 1–4 is used for Huffman-encoding each group of data including four adjacent elements (four tuples) of spectral data.

In the HCB1–HCB4 common table 1100 shown in FIG. 8, the left column 1101 "adrs" shows the address which is used to retrieve data from the table memory, and the right column 1102 "data" shows the code length data which would result when encoding data using each Huffman codebook. Each address for the table memory shown in FIG. 8 is obtained through a bit connecting operation of the lower two bits of the four adjacent elements of spectral data.

Figure 9:
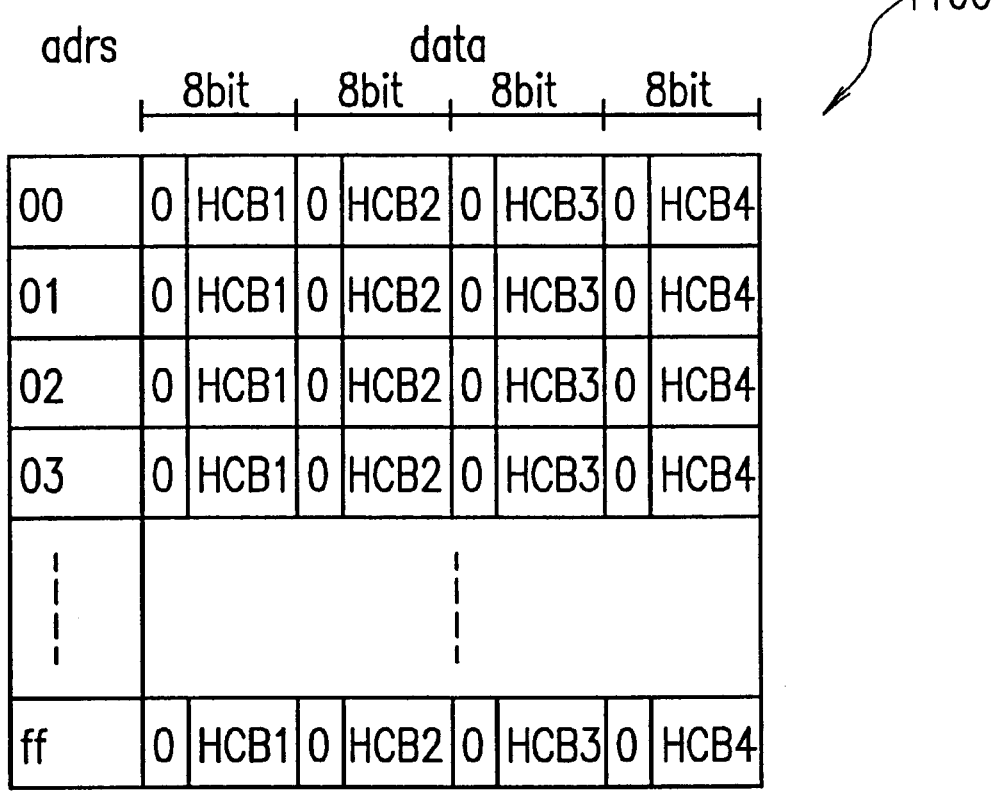
FIG. 9 illustrates a structure of a common table 1100 shown in FIG. 8.

FIG. 9 shows a structure of the HCB1–HCB4 common table 1100 shown in FIG. 8. FIG. 9 illustrates a format used for storing data which represents the code length which would result when encoding 4 tuples of data by using each of the Huffman codebooks 1–4. In FIG. 8, data for each address is 32-bit data and has a structure as shown in FIG.

9. In FIG. 9, "HCB1" included in the most significant 8 bits represents code length data which would result when Huffman-encoding data using the Huffman codebook 1. Similarly, "HCB2", "HCB3" and "HCB4" provided in the following three 8-bit segments represent the code lengths which would result when encoding data using the Huffman codebooks 2, 3 and 4, respectively. The code length data "HCB1" to "HCB4" respectively corresponding to the Huffman codebooks 1–4 are provided in this order from the MSB side to the LSB side.

Each of "HCB1" to "HCB4" can be represented with 8 bits or less. Therefore, where "HCB1" to "HCB4" are stored in a series of 8-bit segments in the HCB1–HCB4 common table 1100, one or more "0" bits are inserted on the MSB side of each of "HCB1" to "HCB4". Such an inserted "0" bit is called a "margin bit". The reason why such a "margin bit" is provided will be described later.

By using the HCB1–HCB4 common table 1100 shown in FIG. 8, the code length which would result from a Huffman encoding operation of spectral data (1, −1, 1, 0) of the third group (SFB2) as shown in FIG. 15 can be obtained as follows.

The address for retrieving data from the table memory is obtained based on Expression (13) below:

$$adrs = ((1\ \&3)<<6) | ((-1\ \&3)<<4) | ((1\ \&3)<<2) | (0\&3) \quad (13).$$

Thus, adrs=h74, thereby obtaining data "h09070907" corresponding to this address. The obtained data "h09070907" indicates that the code lengths for the Huffman codebooks 1–4 are 9 bits (=h09), 7 bits (=h07), 9 bits (=h09), and 7 bits (=h07), respectively. Herein, "h" denotes a hexadecimal representation.

FIG. 10 illustrates the contents of the table memory (the HCB5–HCB10 common table 1300) used for calculating the respective code lengths which would result when encoding two tuples of data using the Huffman codebooks 5–10. Each of the Huffman codebooks 5–10 is used for Huffman-encoding each group of data including two adjacent elements (two tuples) of spectral data.

As in FIG. 8, in the HCB5–HCB10 common table 1300 shown in FIG. 10, the left column 1301 "adrs" shows the address which is used to retrieve data from the table memory, and the right column 1302 "data" shows the code length data which would result when encoding data using each of the Huffman codebooks 5–10. Each address for the table memory shown in FIG. 10 is obtained through a bit connecting operation of the lower five bits of the two adjacent elements of spectral data.

Figure 11:
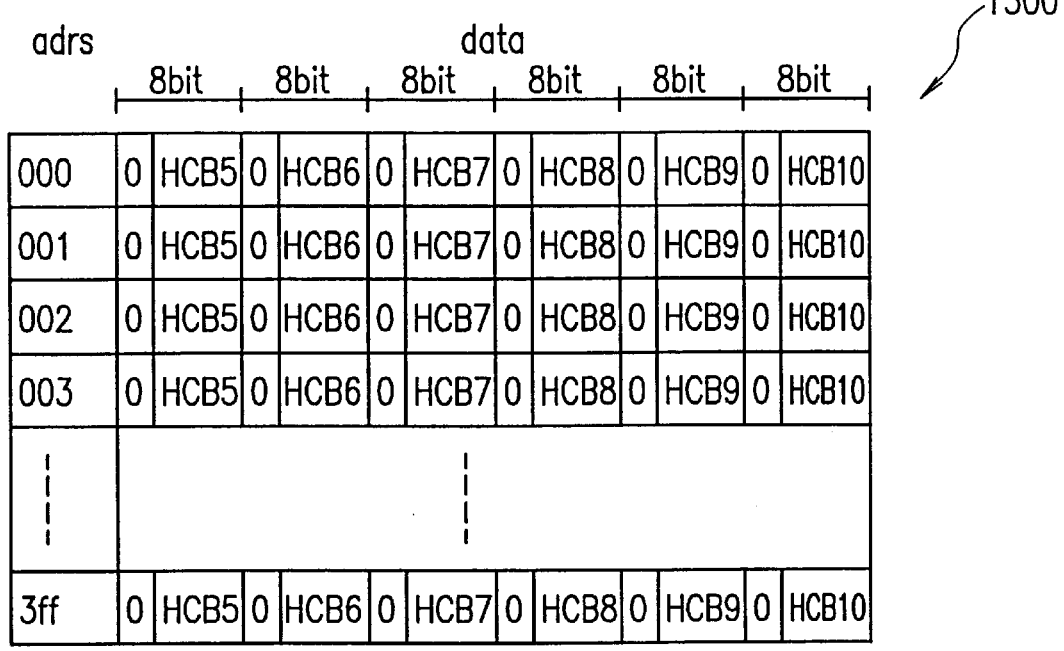
FIG. 11 illustrates a structure of a common table 1300 shown in FIG. 10.

FIG. 11 shows a structure of the HCB5–HCB10 common table 1300 shown in FIG. 10. FIG. 11 illustrates a format used for storing data which represents the code length which would result when encoding 2 tuples of data by using each of the Huffman codebooks 5–10. In FIG. 10, data for each address is 48-bit data and has a structure as shown in FIG. 11. In FIG. 11, "HCB5" included in the most significant 8 bits represents code length data which would result when Huffman-encoding data using the Huffman codebook 5. Similarly, "HCB6", "HCB7", "HCB8", "HCB9" and "HCB10" provided in the following five 8-bit segments represent the code lengths which would result when encoding data using the Huffman codebooks 6, 7, 8, 9 and 10, respectively. Each of "HCB5" to "HCB10" can be represented with 8 bits or less. Therefore, where "HCB5" to "HCB10" are stored in a series of 8-bit segments in the HCB5–HCB10 common table 1300, one or more "0" bits are inserted on the MSB side of each of "HCB5" to "HCB10". Such an inserted "0" bit is called a "margin bit". The reason why such a "margin bit" is provided will be described later.

By using the HCB5–HCB10 common table 1300 shown in FIG. 10, the code length which would result from a Huffman encoding operation of spectral data (4, −2, 0, 3) of the first group (SFB0) as shown in FIG. 15 can be obtained as follows.

For the first retrieval, the address used for retrieving data from the table memory is obtained as follows based on Expression (13) above and spectral data (4, −2).

$$adrs=((4\&31)<<5)|(-2\&31)$$

Thus, adrs=h9e, thereby obtaining data "h0c090b080b08" corresponding to this address.

For the second retrieval, the address used for retrieving data from the table memory is obtained as follows based on spectral data (0, 3).

$$adrs=((0\&31)<<5)|(3\&31)$$

Thus, adrs=h03, thereby obtaining data "h080708070907" corresponding to this address.

The first data "h0c090b080b08" and the second data "h080708070907" are added together to obtain the sum "h1410130e140e". The 8-bit segments of this sum (i.e., "h14", "h10", "h13", "h0e", "h14", "h0e") represent the respective code lengths which would result from a Huffman encoding operation using the Huffman codebooks 5–10. This indicates that the code lengths for the Huffman codebooks 5–10 are 20 bits (=h14), 16 bits (=h10), 19 bits (=h13), 14 bits (=h0e), 20 bits (=h14), and 14 bits (=h0e), respectively. In this way, it is possible to obtain the respective code lengths which would result when Huffman-encoding data using the Huffman codebooks 5–10 of the MPEG2-AAC standard.

As illustrated in FIGS. 9 and 11, the respective code lengths which would result when encoding data using the various Huffman codebooks are stored in 8-bit segments. Therefore, even when as-retrieved data from the table memories shown in FIGS. 8 and 10 is accumulated with no alteration, an overflow will not occur. The code length which would result from a Huffman encoding operation of an SFB is not obtained by a single retrieval operation of table data, but is obtained by accumulating data successively retrieved from the table memory. Therefore, the amount of computation can be reduced by accumulating as-retrieved table data rather than by dividing the retrieved data into segments respectively for the different Huffman codebooks and then accumulating the data segments only for the Huffman codebook of interest. In view of this, according to the present invention, the respective code lengths for the various Huffman codebooks are stored in 8-bit segments with one or more "0" bits (margin bits) being inserted in each 8-bit segment so that an overflow will not occur even when accumulating the as-retrieved table data (with the as retrieved bit length) from the table memory.

The above description has been made in connection with the HCB1–HCB4 common table 1100 (FIG. 9) and the HCB5–HCB10 common table 1300 (FIG. 11). However, substantially the same principle can be applied to other common tables, e.g., the HCB1/HCB2 common table stored in the ROM 114a and the HCB3/HCB4 common table stored in the ROM 115a (FIG. 4).

In the above-described example, an accumulation margin is provided while dividing the code length data into 8-bit segments for better understanding of the present invention and for simplifying the drawings. However, for an encoding scheme according to a wide band AAC standard, it is appropriate to divide the code length data into 11-bit segments for the following reason.

For an encoding scheme according to the AAC standard, the maximum code length which would result from a Huffman encoding operation of 2 tuples of data is 17, and thus can be represented with five bits. For example, such a maximum code length is seen for the index value 154 of Huffman codebook 9 (see ISO/IEC 13818-7 Table A.10. Spectrum Huffman Codebook 9).

For the index value 154 of the Huffman codebook 9, the code length which would result from a Huffman encoding operation using the codebook 9 is 15 bits. As sign information, two bits are added to the 15 bits. Therefore, the number of bits required is 17, which can be represented with five bits. Therefore, the code length data is divided in 11-bit segments (5 bits+6 margin bits=11 bits).

The number of margin bits is six for the following reason. In an encoding scheme according to the AAC standard, the number of data included in each SFB can reach up to 128. This is because the number of data of the highest band SFB is 16 for a short window MDCT process (see ISO/IEC 13818-7 Table 3.5-scalefactor bands for SHORT#WINDOW at 32,44.1 and 48 kHz), and eight short windows can be grouped into a single window group, so that the number of data which can be contained in a single SFB can be up to 128 (=16×8) in total.

When the number of data included in an SFB is 128, then 64 (128/2) accumulations are performed to encode the SFB with a 2-tuple Huffman codebook. Therefore, six bits are required as margin bits (6=log2(64)). Thus, the code length data is divided into 11-bit segments (5 bits for representing the maximum number of bits plus 6 margin bits).

For the reasons as described above, it is appropriate to divide each code length into 11-bit segments for a wide band AAC encoding scheme. However, the number of bits of each segment can be reduced by providing a limitation on the bandwidth for encoding operations and/or the window group for a short window process.

It is understood that the code length can alternatively be divided into segments each having more than 11-bits, e.g., 12 bits, for simplifying the encoding scheme design.

FIGS. 12 and 13 illustrate an example where each code length is divided into 12-bit segments. FIG. 12 illustrates the contents of a table memory (HCB5–HCB10 common table 1500) used for calculating the code lengths for the Huffman codebooks 5–10. The HCB5–HCB10 common table 1500 is obtained based on the HCB5–HCB10 common table 1300 shown in FIG. 10 by rearranging the code lengths contained in the HCB5–HCB10 common table 1300 into 12-bit segments. One or more "0" bits (margin bits) are inserted in each 12-bit segment. FIG. 13 illustrates a structure of the HCB5–HCB10 common table 1500 shown in FIG. 12.

When the HCB5–HCB10 common table 1500 shown in FIG. 12 is stored in the ROM 120*a* shown in FIG. 7, the accumulator 120*c* may be a 72-bit accumulator so that it is possible to accumulate as-retrieved table data from the HCB5–HCB10 common table 1500.

As described above, the present invention provides an encoder for performing a Huffman encoding operation which is capable of simultaneously obtaining the code lengths which would result from a Huffman encoding operation using a plurality of Huffman codebooks. Moreover, even when a selected Huffman codebook is an unsigned codebook, it is possible to obtain through a single retrieval from a table memory the code length which would result from a Huffman encoding operation to which the number of bits required for sign information is added. Thus, it is possible to significantly reduce the amount of computation required for a Huffman encoding operation.

Furthermore, according to the present invention, the code length required for encoding the codebook numbers of Huffman codebooks is reduced, thereby realizing a more efficient Huffman encoding operation.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An encoder, comprising:
   a number G of storage sections (G is an integer equal to or greater than 1) for storing a number G of groups of data;
   a Huffman codebook selection section for selecting one of a number H of Huffman codebooks (H is an integer equal to or greater than 1) for each of the groups of data stored in the respective storage sections, each of the Huffman codebooks having a codebook number;
   a number G of Huffman encoding sections, each of the Huffman encoding sections Huffman-encoding a corresponding one of the G groups of data by using one of the Huffman codebooks which is selected by the Huffman codebook selection section for the one group of data; and
   a codebook number encoding section for encoding the codebook number of each Huffman codebook selected by the Huffman codebook selection section, wherein:
   the Huffman codebook selection section includes a code length calculation section for calculating a code length which would result from a Huffman encoding operation of each of the G groups of data using each Huffman codebook, and a control section for selecting one of the Huffman codebooks which is suitable for the group of data based on the code length calculated by the code length calculation section; and
   when the Huffman codebook selected is an unsigned codebook, a number of bits required for sign information has previously been added to the code length calculated by the code length calculation section.

2. An encoder according to claim 1, wherein the code length calculation section has a table of data including a code length previously calculated for each Huffman codebook.

3. An encoder, comprising:
   a number G of storage sections (G is an integer equal to or greater than 1) storing a number G of groups of data;
   a Huffman codebook selection section for selecting one of a number H of Huffman codebooks (His an integer equal to or greater than 1) for each of the groups of data stored in the respective storage sections, each of the Huffman codebooks having a codebook number;
   a number G of Huffman encoding sections, each of the Huffman encoding sections Huffman-encoding a corresponding one of the G groups of data by using one of the Huffman codebooks which is selected by the Huffman codebook selection section for the one group of data; and
   a codebook number encoding section for encoding the codebook number of each Huffman codebook selected by the Huffman codebook selection section, wherein:

the Huffman codebook selection section includes a code length calculation section for calculating a code length which would result from a Huffman encoding operation of each of the G groups of data using each Huffman codebook, and a control section for selecting one of the Huffman codebooks which is suitable for the group of data based on the code length calculated by the code length calculation section; and the code length calculation section is capable of simultaneously obtaining code lengths for a plurality of Huffman codebooks.

4. An encoder according to claim 3, wherein:

the code length calculation section is adapted to output respective code lengths which would result from Huffman encoding operations of the one group of data, for a plurality of Huffman codebooks; and the control section selects one of the Huffman codebooks for which a smallest code length is output from the code length calculation section.

5. An encoder according to claim 3, wherein:

the code length calculation section is adapted to output respective code lengths which would result from Huffman encoding operations of the one group of data, for a plurality of Huffman codebooks; and the control section selects one of the Huffman codebooks based on the code length of the Huffman codebook output from the code length calculation section and in view of the codebook number of the Huffman codebook.

6. An encoder according to claim 5, wherein the control section selects one of the Huffman codebooks for a $(g+1)^{th}$ group of data (g is an integer such that $1 \leq g \leq G-1$) by first obtaining a code length Bmin and another code length Bg, the code length Bmin being a code length which would result from a Huffman encoding operation of the $(g+1)^{th}$ group of data using a Huffman codebook Hmin for which a smallest code length is output from the code length calculation section, and the code length Bg being a code length which would result from a Huffman encoding operation of a $g^{th}$ group of data using a Huffman codebook Hg which has been selected for the $g^{th}$ group of data, and then selecting the Huffman codebook Hmin if Bmin<(Bg−A) (A is a predetermined integer) or the Huffman codebook Hg if Bmin≧(Bg−A).

7. An encoder according to claim 6, wherein the control section selects one of the Huffman codebooks for which a smallest code length is output from the code length calculation section as a Huffman codebook for a first group of data.

8. An encoder according to claim 5, wherein the control section selects one of the Huffman codebooks for a $(g−1)^{th}$ group of data (g is an integer such that $2 \leq g \leq G$) by first obtaining a code length Bmin and another code length Bg, the code length Bmin being a code length which would result from a Huffman encoding operation of the $(g−1)^{th}$ group of data using a Huffman codebook Hmin for which a smallest code length is output from the code length calculation section, and the code length Bg being a code length which would result from a Huffman encoding operation of a $g^{th}$ group of data using a Huffman codebook Hg which has been selected for the $g^{th}$ group of data, and then selecting the Huffman codebook Hmin if Bmin<(Bg−A) (A is a predetermined integer) or the Huffman codebook Hg if Bmin≧(Bg−A).

9. An encoder according to claim 8, wherein the control section selects one of the Huffman codebooks for which a smallest code length is output from the code length calculation section as a Huffman codebook for a $G^{th}$ group of data.

10. An encoder according to claim 6, wherein when a same Huffman codebook is selected for two or more contiguous groups of data, the codebook number encoding section encodes the codebook number of the Huffman codebook and the number of the contiguous groups of data with a number of bits equal to the predetermined integer A.

11. An encoder according to claim 3, wherein the H Huffman codebooks are eleven Huffman codebooks used for Huffman-encoding of spectral data as defined in the MPEG2-AAC standard.

12. An encoder according to claim 11, wherein:

the code length calculation section is adapted to output respective code lengths which would result when encoding data using Huffman codebooks 1–4 defined in the MPEG2-AAC standard; and the code length calculation section has a first table including respective code lengths which would result when encoding data by using Huffman codebooks 1 and 2 for a common index value and a second table including respective code lengths which would result when encoding data by using Huffman codebooks 3 and 4 for the common index value.

13. An encoder according to claim 12, wherein a number of bits required for sign information has previously been added to each of the code lengths for Huffman codebooks 3 and 4 which are included in the second table.

14. An encoder according to claim 13, wherein the first table includes respective values of T1(F1(a, b, c, d)) and T2(F1(a, b, c, d)) for i1, and the second table includes respective values of T3(F2(a, b, c, d))+nonz(a, b, c, d) and T4(F2(a, b, c, d))+nonz(a, b, c, d) for i2, where:

nonz(w, x, y, z) is a function which gives the number of non-zero values among w, x, y and z;

F1(w, x, y, z) is a function defined as follows: F1(w, x, y, z)=27*(w+1)+9*(x+1)+3*(y+1)+(z+1) (where an absolute value of each of w, x, y and z is 1 or less);

F2(w, x, y, z) is a function defined as follows: F2(w, x, y, z)=27*abs(w)+9*abs(x)+3*abs(y)+abs(z) (where an absolute value of each of w, x, y and z is 2 or less);

abs(x) is a function which gives an absolute value of x;

T1(index) to T4(index) are each a function which gives a code length which would result when encoding data by using Huffman codebooks 1 to 4, respectively;

a, b, c and d are integers representing a group of data; and i1 and i2 are index values calculated as a function of the integers a, b, c and d.

15. An encoder according to claim 14, wherein:

i1=(X^3)*(a+1)+(X^2)*(b+1)+X*(c+1)+(d+1), where X is a positive number equal to or greater than 3;

i2=(Y^3)*abs(a)+(Y^2)*abs(b)+Y*abs(c)+abs(d), where Y is a positive number equal to or greater than 3; and the symbol "^" denotes an exponentiation.

16. An encoder according to claim 14, wherein:

the index value i1 is obtained through a bit connecting operation of a, b, c and d each of which is represented with X bits or more, where X is a positive number equal to or greater than 2; and the index value i2 is obtained through a bit connecting operation of abs(a), abs(b), abs(c) and abs(d) each of which is represented with Y bits or more, where Y is a positive number equal to or greater than 2.

17. An encoder according to claim 11, wherein:
the code length calculation section is adapted to output respective code lengths which would result when encoding data using Huffman codebooks 1–4 defined in the MPEG2-AAC standard; and
the code length calculation section has a table of data including respective code lengths which would result when encoding data by using Huffman codebooks 1 to 4 for a common index value.

18. An encoder according to claim 17, wherein a number of bits required for sign information has previously been added to each of the code lengths for Huffman codebooks 3 and 4 which are included in the table.

19. An encoder according to claim 18, wherein the table includes respective values of T1(F1(a, b, c, d)), T2(F1(a, b, c, d)), T3(F2(a, b, c, d))+nonz(a, b, c, d) and T4(F2(a, b, c, d))+nonz(a, b, c, d) for j, where:
nonz(w, x, y, z) is a function which gives the number of non-zero values among w, x, y and z;
F1(w, x, y, z) is a function defined as follows: F1(w, x, y, z)=27*(w+1)+9*(x+1)+3*(y+1)+(z+1) (where an absolute value of each of w, x, y and z is 1 or less);
F2(w, x, y, z) is a function defined as follows: F2(w, x, y, z)=27*abs(w)+9*abs(x)+3*abs(y)+abs(z) (where an absolute value of each of w, x, y and z is 2 or less);
abs(x) is a function which gives an absolute value of x;
T1(index) to T4(index) are each a function which gives a code length which would result when encoding data by using Huffman codebooks 1 to 4, respectively;
a, b, c and d are integers representing a group of data; and
j is an index value calculated as a function of the integers a, b, c and d.

20. An encoder according to claim 19, wherein the index value j is obtained through a bit connecting operation of a, b, c and d each of which is represented with Y bits or more, where Y is a positive number equal to or greater than 2.

21. An encoder according to claim 11, wherein:
the code length calculation section is adapted to output respective code lengths which would result when encoding data using Huffman codebooks 5–10 defined in the MPEG2-AAC standard; and
the code length calculation section has a first table including respective code lengths which would result when encoding data by using Huffman codebooks 5 and 6 for a common index value, a second table including respective code lengths which would result when encoding data by using Huffman codebooks 7 and 8 for a common index value, and a third table including respective code lengths which would result when encoding data by using Huffman codebooks 9 and 10 for a common index value.

22. An encoder according to claim 21, wherein:
a number of bits required for sign information has previously been added to each of the code lengths for Huffman codebooks 7 and 8 which are included in the second table; and
a number of bits required for sign information has previously been added to each of the code lengths for Huffman codebooks 9 and 10 which are included in the third table.

23. An encoder according to claim 22, wherein the first table includes respective values of T5(F3(a, b)) and T6(F3(a, b)) for i3, the second table includes respective values of T7(F4(a, b))+nonz(a, b) and T8(F4(a, b))+nonz(a, b) for i4, and the third table includes respective values of T9(F5(a, b))+nonz(a, b) and T10(F5(a, b))+nonz(a, b) for i5, where:
nonz(x, y) is a function which gives the number of non-zero values among x and y;
F3(x, y) is a function defined as follows: F3(x, y)=9*(x+4)+(y+4) (where an absolute value of each of x and y is 4 or less);
F4(x, y) is a function defined as follows: F4(x, y)=8*abs(x)+abs(y) (where an absolute value of each of x and y is 7 or less);
F5(x, y) is a function defined as follows: F5(x, y)=13*abs(x)+abs(y) (where an absolute value of each of x and y is 12 or less);
abs(x) is a function which gives an absolute value of x;
T5(index) to T10(index) are each a function which gives a code length which would result when encoding data by using Huffman codebooks 5 to 10 defined in the MPEG2-AAC standard, respectively;
a and b are integers representing a group of data; and
i3, i4 and i5 are index values calculated as a function of the integers a and b.

24. An encoder according to claim 23, wherein:
i3=X*(a+4)+(b+4), where X is a positive number equal to or greater than 9;
i4=Y*abs(a)+abs(b), where Y is a positive number equal to or greater than 8; and
i5=Z*abs(a)+abs(b), where Z is a positive number equal to or greater than 13.

25. An encoder according to claim 24, wherein:
the index value i3 is obtained through a bit connecting operation of a and b each of which is represented with X bits or more, where X is a positive number equal to or greater than 4;
the index value i4 is obtained through a bit connecting operation of a and b each of which is represented with Y bits or more, where Y is a positive number equal to or greater than 4; and
the index value i5 is obtained through a bit connecting operation of a and b each of which is represented with Z bits or more, where Z is a positive number equal to or greater than 5.

26. An encoder according to claim 11, wherein:
the code length calculation section is adapted to output respective code lengths which would result when encoding data using Huffman codebooks 5–10 defined in the MPEG2-AAC standard; and
the code length calculation section has a table including respective code lengths which would result when encoding data by using Huffman codebooks 5 to 10 for a common index value.

27. An encoder according to claim 26, wherein a number of bits required for sign information has previously been added to each of the code lengths for Huffman codebooks 7 to 10 which are included in the table.

28. An encoder according to claim 27, wherein the table includes respective values of T5(F3(a, b)), T6(F3(a, b)), T7(F4(a, b))+nonz(a, b), T8(F4(a, b))+nonz(a, b), T9(F5(a, b))+nonz(a, b) and T10(F5(a, b))+nonz(a, b) for k, where:
nonz(x, y) is a function which gives the number of non-zero values among x and y;
F3(x, y) is a function defined as follows: F3(x, y)=9*(x+4)+(y+4) (where an absolute value of each of x and y is 4 or less);
F4(x, y) is a function defined as follows: F4(x, y)=8*abs(x)+abs(y) (where an absolute value of each of x and y is 7 or less);

F5(x, y) is a function defined as follows: F5(x, y)=13*abs(x)+abs(y) (where an absolute value of each of x and y is 12 or less);

abs(x) is a function which gives an absolute value of x;

T5(index) to T10(index) are each a function which gives a code length which would result when encoding data by using Huffman codebooks 5 to 10 defined in the MPEG2-AAC standard, respectively;

a and b are integers representing a group of data; and k is an index value calculated as a function of the integers a and b.

29. An encoder according to claim 28, wherein the index value k is obtained through a bit connecting operation of a and b each of which is represented with Z bits or more, where Z is a positive number equal to or greater than 5.

30. An encoder according to claim 3, wherein:

the code length calculation section is adapted to output an invalid signal which indicates that a Huffman codebook is invalid when an input data value is outside a variable range within which a code length can be calculated using the Huffman codebook; and the control section is adapted not to select a Huffman codebook when the control section receives an invalid signal for the Huffman codebook.

31. An encoder according to claim 14, wherein:

the value of the function T1(F1(a, b, c, d)) and the value of the function T2(F1(a, b, c, d)) are stored respectively on a MSB side and on a LSB side with respect to the index value i1, with at least m1 bits of "0" (m1 is a positive integer) being inserted between the value of the function T1 and the value of the function T2; and the value of the function T3(F2(a, b, c, d))+nonz(a, b, c, d) and the value of the function T4(F2(a, b, c, d))+nonz(a, b, c, d) are stored respectively on a MSB side and on a LSB side with respect to the index value i2, with at least m1 bits of "0" being inserted between the value of the function T3 and the value of the function T4.

32. An encoder according to claim 19, wherein:

the value of the function T1(F1(a, b, c, d)), the value of the function T2(F1(a, b, c, d)), the value of the function T3(F2(a, b, c, d))+nonz(a, b, c, d) and the value of the function T4(F2(a, b, c, d))+nonz(a, b, c, d) are stored in this order from a MSB side to a LSB side with respect to the index value j, with at least m1 bits of "0" (m1 is a positive integer) being inserted between the value of T1 and the value of T2, between the value of T2 and the value of T3, and between the value of T3 and the value of T4.

33. An encoder according to claim 31, wherein the value of m1 is an integer value obtained by rounding up a value of the logarithm of 2 to the base of n1 ($\log_2(n1)$), where n1 is a value obtained by dividing a maximum number of data included in each group among the G groups of data by 4.

34. An encoder according to claim 23, wherein:

the value of the function T5 (F3(a, b)) and the value of the function T6(F3(a, b)) are stored respectively on a MSB side and on a LSB side with respect to the index value i3, with at least m2 bits of "0" (m2 is a positive integer) being inserted between the value of the function T5 and the value of the function T6;

the value of the function T7(F4(a, b))+nonz(a, b) and the value of the function T8(F4(a, b))+nonz(a, b) are stored respectively on a MSB side and on a LSB side with respect to the index value i4, with at least m2 bits of "0" being inserted between the value of the function T7 and the value of the function T8; and the value of the function T9(F5(a, b))+nonz(a, b) and the value of the function T10(F5(a, b))+nonz(a, b) are stored respectively on a MSB side and on a LSB side with respect to the index value i5, with at least m2 bits of "0" being inserted between the value of the function T9 and the value of the function T10.

35. An encoder according to claim 28, wherein the value of the function T5(F3(a, b)), the value of the function T6(F3(a, b)), the value of the function T7(F4(a, b))+nonz(a, b), the value of the function T8(F4(a, b))+nonz(a, b), the value of the function T9(F5(a, b))+nonz(a, b) and the value of the function T10(F5(a, b))+nonz(a, b) are stored in this order from a MSB side to a LSB side with respect to the index value k, with at least m2 bits of "0" (m2 is a positive integer) being inserted between the value of T5 and the value of T6, between the value of T6 and the value of T7, between the value of T7 and the value of T8, between the value of T8 and the value of T9, and between the value of T9 and the value of T10.

36. An encoder according to claim 34, wherein the value of m2 is an integer value obtained by rounding up a value of the logarithm of 2 to the base of n2 ($\log_2(n2)$), where n2 is a value obtained by dividing a maximum number of data included in each group among the G groups of data by 2.

* * * * *

UNITED STATES PATENT AND TRADEMARK OFFICE
CERTIFICATE OF CORRECTION

PATENT NO.    : 6,484,142 B1
DATED         : November 19, 2002
INVENTOR(S)   : Miyasaka et al.

It is certified that error appears in the above-identified patent and that said Letters Patent is hereby corrected as shown below:

Column 26,
Line 55, "His" should be -- H is --.

Column 27,
Beginning line 9, should read -- the code length calculation section has at least one table including respective code lengths which would result when encoding data by using a plurality of Huffman codebooks for a common index value so as to simultaneously obtain code lengths for the plurality of Huffman codebooks. --

Signed and Sealed this

Eighth Day of April, 2003

JAMES E. ROGAN
*Director of the United States Patent and Trademark Office*